United States Patent
Lee et al.

(10) Patent No.: US 10,377,948 B2
(45) Date of Patent: Aug. 13, 2019

(54) ETCHING COMPOSITION AND METHOD FOR FABRICATING SEMICONDUCTOR DEVICE BY USING THE SAME

(71) Applicant: Samsung Electronics Co., Ltd., Suwon-si, Gyeonggi-do (KR)

(72) Inventors: Hyo Sun Lee, Daejeon (KR); Ho Young Kim, Hwaseong-si (KR); Sang Won Bae, Suwon-si (KR); Min Goo Kim, Seoul (KR); Jung Hun Lim, Daejeon (KR); Yong Jae Choi, Gyeongsangbuk-do (KR)

(73) Assignees: Samsung Electronics Co., Ltd., Gyeonggi-do (KR); Soulbrain Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/809,597

(22) Filed: Nov. 10, 2017

(65) Prior Publication Data

US 2018/0148645 A1    May 31, 2018

(30) Foreign Application Priority Data

Nov. 29, 2016 (KR) .................. 10-2016-0160023

(51) Int. Cl.
*C09K 13/04* (2006.01)
*C09K 13/06* (2006.01)
(Continued)

(52) U.S. Cl.
CPC .............. *C09K 13/06* (2013.01); *C09K 13/04* (2013.01); *C09K 13/10* (2013.01); *H01L 21/31111* (2013.01); *H01L 21/32134* (2013.01)

(58) Field of Classification Search
CPC ........ C09K 13/06; C09K 13/10; C09K 13/04; H01L 21/31111; H01L 21/32134
(Continued)

(56) References Cited

U.S. PATENT DOCUMENTS 6,468,913 B1 * 10/2002 Pasqualoni .............. C09G 1/02
216/89
7,098,135 B2  8/2006 Chung et al.
(Continued)

FOREIGN PATENT DOCUMENTS

JP          4535232 B2     9/2010
JP       2016108659 A     6/2016
(Continued)

OTHER PUBLICATIONS

Wikipedia, "Propionic acid", via https://en.wikipedia.org/wiki/Propionic_acid ; pp. 1-5; (Year: 2018).*
(Continued)

*Primary Examiner* — Binh X Tran
(74) *Attorney, Agent, or Firm* — Harness, Dickey & Pierce, P.L.C.

(57) ABSTRACT

An etching composition selectively removes a titanium nitride film from a stacked conductive film structure including a titanium nitride (TiN) film and a tantalum nitride (TaN) film. The etching composition configured to etch titanium nitride (TiN) includes 5 wt % to 30 wt % of hydrogen peroxide, 15 wt % to 50 wt % of acid compound, and 0.001 wt % to 5 wt % of corrosion inhibitor, with respect to a total weight of the etching composition, wherein the acid compound includes at least one of phosphoric acid ($H_3PO_4$), nitric acid ($HNO_3$), hydrochloric acid (HCl), hydroiodic acid (HI), hydrobromic acid (HBr), perchloric acid ($HNO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$).

19 Claims, 17 Drawing Sheets

(51) Int. Cl.
*C09K 13/10* (2006.01)
*H01L 21/311* (2006.01)
*H01L 21/3213* (2006.01)

(58) Field of Classification Search
USPC .................................. 252/79.1, 79.2, 79.4
See application file for complete search history.

(56) References Cited

U.S. PATENT DOCUMENTS

| | | | |
|---|---|---|---|
| 7,695,992 B2 | 4/2010 | Lee | |
| 2004/0175942 A1* | 9/2004 | Chang | C09G 1/02 438/689 |
| 2006/0249482 A1* | 11/2006 | Wrschka | C09G 1/02 216/88 |
| 2006/0284277 A1 | 12/2006 | Chung et al. | |
| 2010/0051066 A1 | 3/2010 | Kuwabara et al. | |
| 2010/0167547 A1* | 7/2010 | Kamimura | C09G 1/02 438/693 |
| 2014/0038420 A1 | 2/2014 | Chen et al. | |
| 2015/0247087 A1 | 9/2015 | Kamimura et al. | |
| 2016/0200975 A1 | 7/2016 | Cooper et al. | |
| 2016/0257880 A1 | 9/2016 | Hong et al. | |

FOREIGN PATENT DOCUMENTS

| | | |
|---|---|---|
| KR | 20030057204 A | 7/2003 |
| KR | 100486300 B1 | 4/2005 |
| KR | 20070070874 A | 7/2007 |
| KR | 100831257 B1 | 5/2008 |
| KR | 100953022 B1 | 4/2010 |
| KR | 20110077281 A | 7/2011 |
| KR | 101339316 B1 | 12/2013 |
| KR | 20150050948 A | 5/2015 |
| KR | 101587758 B1 | 1/2016 |
| KR | 101602499 B1 | 3/2016 |
| KR | 101608088 B1 | 4/2016 |
| WO | WO-2011010872 A2 | 1/2011 |
| WO | WO-2011010879 A2 | 1/2011 |

OTHER PUBLICATIONS

Wikipedia, "Reverse Osmosis" via https://en.wikipedia.org/wiki/Reverse_osmosis<b>;</b> pp. 1-13; (Year: 2018).*

* cited by examiner

US 10,377,948 B2

ETCHING COMPOSITION AND METHOD FOR FABRICATING SEMICONDUCTOR DEVICE BY USING THE SAME

CROSS REFERENCE TO RELATED APPLICATION

This application claims priority from Korean Patent Application No. 10-2016-0160023 filed on Nov. 29, 2016 in the Korean Intellectual Property Office, and all the benefits accruing therefrom under 35 U.S.C. 119, the contents of which in its entirety are herein incorporated by reference.

BACKGROUND

1. Technical Field

Some example embodiments of the present disclosure relates to an etching composition and a method for fabricating a semiconductor device by using the same, and more specifically, to an etching composition to selectively remove titanium nitride (TiN) on a conductive film, and a method for fabricating a semiconductor device by using the same.

2. Description of the Related Art

The recent dramatic increase in the distribution of information media has led to remarkable advancement in the functionalities of semiconductor devices. To ensure higher competitiveness, new semiconductor products are required to meet demands for lower costs and higher quality by way of higher integration. The semiconductor scale-down continues to achieve higher integration.

To achieve scale-down of a semiconductor device, a high-k insulating film is used. Further, to reduce or prevent the Fermi level pinning, a metal material having a proper work function is used as a gate electrode on the high-k insulating film. The gate electrode, which includes a metal material, may include titanium-based materials (e.g., titanium (Ti) and titanium nitride (TiN)) or tantalum-based materials (e.g., tantalum (Ta) and tantalum nitride (TaN)).

An optimum or desirable work function for a metal gate electrode varies between a NMOS transistor and a PMOS transistor. Accordingly, when a same material is used for the metal gate electrodes of the NMOS and PMOS transistors, one gate electrode of the NMOS and PMOS transistors may not exhibit a desired work function. The gate electrode of the NMOS transistor may use a different material and/or a different film structure from the gate electrode of the PMOS transistor. To implement different work functions from each other, titanium nitride and tantalum nitride may be used in the gate electrode.

SUMMARY

Some example embodiments of the present disclosure provide an etching composition to selectively remove a titanium nitride film from a stacked conductive film structure including a titanium nitride (TiN) film and a tantalum nitride (TaN) film.

Other example embodiments of the present disclosure provide a method for fabricating a semiconductor device using an etching composition to selectively remove a titanium nitride film from a stacked conductive film structure including the titanium nitride film and the tantalum nitride film.

The present disclosure is not limited to the example embodiments set forth above and example embodiments other than those set forth above will be clearly understood to a person skilled in the art from the following description.

According to an example embodiment of the present inventive concepts, an etching composition configured to etch titanium nitride (TiN) includes with respect to a total weight of the etching composition, 5 wt % to 30 wt % of hydrogen peroxide, 15 wt % to 50 wt % of acid compound, and 0.001 wt % to 5 wt % of corrosion inhibitor, wherein the acid compound comprises at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$).

According to another example embodiment of the present inventive concepts, an etching composition configured to etch titanium nitride (TiN includes hydrogen peroxide, acid compound, and corrosion inhibitor, wherein a ratio of a weight of the acid compound with respect to a weight of the hydrogen peroxide is from 1 to 7, and the acid compound comprises at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BrO_3$), acetic acid ($CH_3COOH$), propionic acid ($C_2H_5COOH$), lactic acid ($CH_3CH(OH)COOH$), and glycolic acid ($HOCH_2COOH$).

According to still another example embodiment of the present inventive concepts, a method for fabricating a semiconductor device includes forming an interlayer insulating film including a first trench and a second trench; forming a first TaN film along a sidewall and a bottom surface of the first trench, and forming a second TaN film along a sidewall and a bottom surface of the second trench; forming a first TiN film on the first TaN film and a second TiN film on the second TaN film; forming a mask pattern on the second TiN film; and exposing the first TaN film by removing the first TiN film with wet etching by using the mask pattern, wherein the wet etching uses an etching composition, the etching composition comprises 5 wt % to 30 wt % of hydrogen peroxide, 15 wt % to 50 wt % of acid compound, and 0.001 wt % to 5 wt % of corrosion inhibitor, with respect to a total weight of the etching composition, and the acid compound comprises at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$).

BRIEF DESCRIPTION OF THE DRAWINGS

The above and other features and advantages of the present disclosure will become more apparent to those of ordinary skill in the art by describing in detail example embodiments thereof with reference to the accompanying drawings.

DETAILED DESCRIPTION

Figure 1:
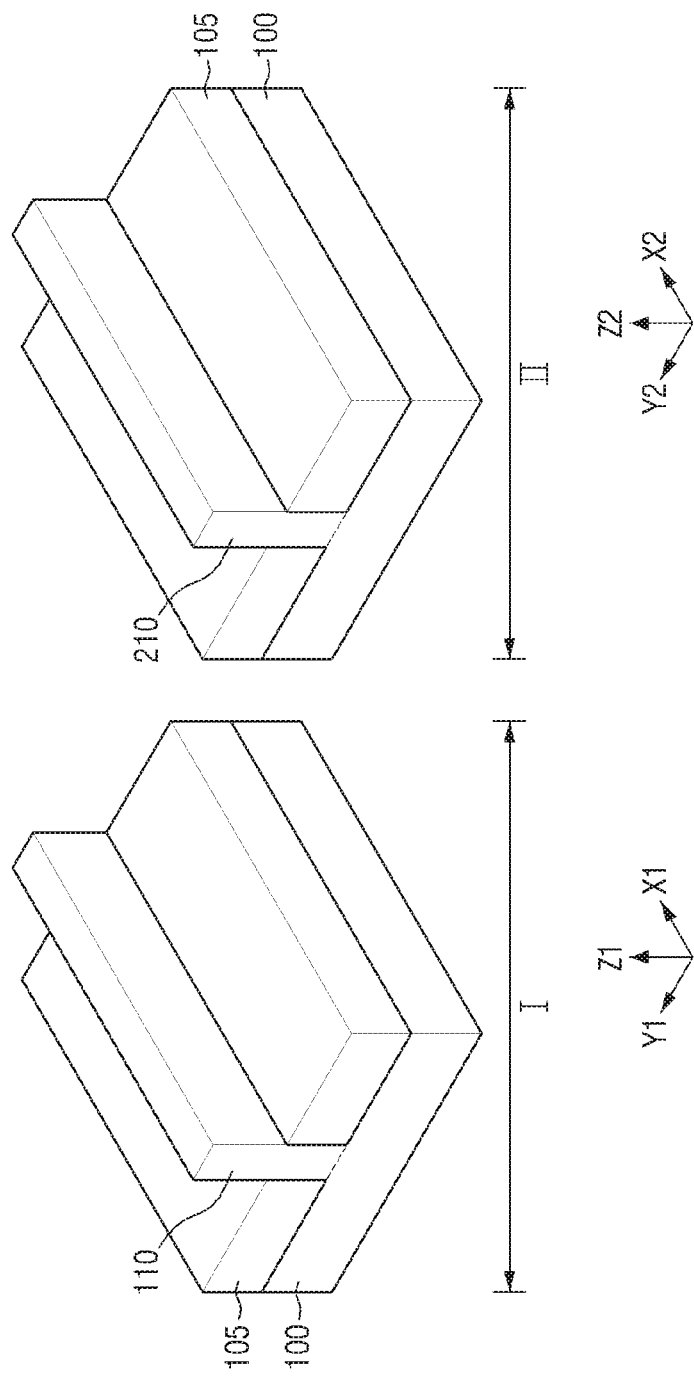
FIGS. 1 to 14 are views illustrating intermediate stages of fabrication illustrating a method for fabricating a semiconductor device by using an etching composition according to some example embodiments of the present disclosure.

The term "alkyl" represents an aliphatic hydrocarbon group. The alkyl part may be a "saturated alkyl group," representing that any alkene or alkyne part is not included. The alkyl part may be also an "unsaturated alkyl part," representing that at least one alkene or alkyne part is included. The "alkene" part represents a group in which at least two carbon atoms are formed with at least one carbon-carbon double bond, and the "alkyne" part represents a group in which at least two carbon atoms are formed with at least one carbon-carbon triple bond.

The alkyl group may be substituted or unsubstituted. When being substituted, a substituted group is one or more groups separately and independently selected from amino, including cycloalkyl, aryl, heteroaryl, heteroalicyclic, hydroxy, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, isocyanato, thiocyanate, isothiocyanate, nitro, silyl, trihalomethanesulfonyl, amino including mono- and de-substituted amino groups, and protected derivatives thereof. A typical alkyl group may include methyl, ethyl, propyl, isopropyl, butyl, isobutyl, tertiary butyl, pentyl, hexyl, ethenyl, prophenyl, butenyl, cyclopropyl, cyclobutyl, cyclopentyl, cyclohexyl, etc., but not limited hereto.

For example, an etching composition to be described below may be an etching solution to etch titanium nitride.

For another example, the etching composition to be described below may be an etching solution to selectively remove a titanium nitride film from a stacked film of a titanium nitride film and a tantalum nitride film.

The etching composition according to some example embodiments may include hydrogen peroxide ($H_2O_2$), acid compound, corrosion inhibitor, and solvent.

The titanium nitride film is selectively removed from the layered film of the titanium nitride film and the tantalum nitride film using the etching composition.

The etching composition includes hydrogen peroxide. Hydrogen peroxide may be used as oxidizing agent.

Hydrogen peroxide may oxidize the titanium nitride film. That is, hydrogen peroxide may change the titanium nitride film into the titanium oxide film.

The etching composition may include 5 wt % to 30 wt % of hydrogen peroxide with respect to a total weight of the etching composition. For example, the etching composition may include 12 wt % to 30 wt % of hydrogen peroxide with respect to a total weight of the etching composition. For example, the etching composition may include 15 wt % to 25 wt % of hydrogen peroxide with respect to a total weight of the etching composition.

When hydrogen peroxide is less than the range mentioned above, the titanium nitride film may not be sufficiently oxidized. Accordingly, the etch rate of the titanium nitride film may be lowered.

When hydrogen peroxide exceeds the range mentioned above, oxidization may occur on other films (e.g., tantalum nitride film) as well as titanium nitride film. In example embodiments, etch selectivity of the tantalum nitride film with respect to the titanium nitride film may be lowered.

The etching composition may include the acid compound. The acid compound may adjust pH of the etching composition.

The acid compound may include organic acid or inorganic acid. The acid compound may include, for example, at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$).

In the etching composition according to some example embodiments, the acid compound may include phosphoric acid. For example, the acid compound may be phosphoric acid.

In the etching composition according to some example embodiments, the acid compound may not include a sulfur-based compound. As used herein, statement "(does) not include sulfur-based compound" does not necessarily mean that the etching composition does not include a sulfur ion.

When the etching composition includes sulfuric acid and hydrogen peroxide, Caro's acid ($H_2SO_5$) may be formed from a reaction between sulfuric acid and hydrogen peroxide. Caro's acid formed as described above may excessively etch the tantalum nitride film as well as etching the titanium nitride film. That is, when sulfuric acid is included in the etching composition, side reaction may occur tantalum nitride film is over-etched as well as the titanium nitride film.

The etching composition may include 15 wt % to 50 wt % of the acid compound with respect to a total weight of the etching composition. For example, the etching composition may include 20 wt % to 40 wt % of the acid compound with respect to a total weight of the etching composition.

When the acid compound is less than the range mentioned above, the etching of the titanium nitride film may not sufficiently occur. Accordingly, etch rate of the titanium nitride film may be lowered.

When the acid compound exceeds the range mentioned above, other films (e.g., tantalum nitride film) may be considerably etched as well as the titanium nitride film. In such case, etch selectivity of the tantalum nitride film with respect to the titanium nitride film may be lowered.

The etching composition may include the corrosion inhibitor. The corrosion inhibitor may be adsorbed onto films other than the etched film, thus preventing or reducing the films other than the etched film being etched with etching composition.

For example, the corrosion inhibitor may include at least one of ammonium peroxysulfate, ammonium sulfate, monoammonium phosphate, diammonium phosphate, tri ammonium phosphate, ammonium chloride, ammonium acetate, ammonium carbonate, ammonium nitrate, ammonium iodide, 1,2,4-triazole, 3-aminotriazole, 5-aminotetrazole, benzotriazole, pyrazole, imidazole, ascorbic acid, citric acid, succinic acid, maleic acid, malonic acid, thioglycolic acid, tannic acid, methyl gallate, ethyl gallate, and propyl gallate.

At least part of the corrosion inhibitor may include a nitrogen atom having noncovalent electron pairs, but not limited hereto. Using the noncovalent electron pairs, the corrosion inhibitor may be adsorbed onto other films other than the etched film to reduce or prevent the other films other than the etched film from being etched.

Ammonium hydroxide may include the noncovalent electron pairs, but the corrosion inhibitor may not include ammonium hydroxide. Ammonium hydroxide is a basic material. When the etching composition includes ammonium hydroxide, pH of the etching composition may be elevated. Accordingly, etching of the titanium nitride film may not sufficiently occur.

The etching composition may include 0.001 wt % to 5 wt % of the corrosion inhibitor with respect to a total weight of the etching composition.

When the corrosion inhibitor is less than the range mentioned above, a surface of the tantalum oxide film, which is the oxidized tantalum nitride film or tantalum nitride film, may not be protected.

When the corrosion inhibitor exceeds the range mentioned above, the corrosion inhibitor may be adsorbed strongly onto the surface of the film to the extent that it may not be removed in a subsequent clean process. The unremoved corrosion inhibitor may affect the subsequent process.

The etching composition may include a remainder of solvent. The solvent may be, for example, deionized water. The solvent may be added to the etching composition such that the etching composition may be 100 wt %.

With respect to a total weight of the etching composition, the etching composition may include 15 wt % to 79 wt % of the solvent.

In the etching composition according to some example embodiments, of the etching composition may be less than or equal to 2.

According to some example embodiments, the etching composition may further include a chelating agent.

The chelating agent may include, for example, at least one of ethylenediaminetetraacetic acid, iminodiacetic acid, diethylenetriaminepentaacetic acid, glycine, alanine, valine, leucine, isoleucine, serine, threonine, tyrosine, phenylalanine, tryptophane, aspartic acid, glutamic acid, glutamine, asparagine, lysine, arginine, histidine, hydroxylysine, cysteine, methionine, cystine, proline, sulfamic acid, and hydroxyproline.

When the etching composition includes the chelating agent, the etching composition may include 0.001 wt % to 5 wt % of the chelating agent with respect to a total weight of the etching composition.

According to some example embodiments, the etching composition may further include a surfactant.

The surfactant may include, for example, at least one of alkyl sulfonate, ammonium alkyl sulfonate, alkyl ether sulfonate, alkyl aryl ether sulfonate, alkyl phosphate, ammonium alkyl phosphate, alkyl ether phosphate, alkyl aryl ether phosphate, fluoroalkyl sulfonimide, ammonium fluoroalkyl sulfonimide, $C_nH_{2n+1}CH_2CH_2SO_3\_NH_{4+}$, $C_nH_{2n+1}CH_2CH_2SO_3H$, $(C_nH_{2n+1}CH_2CH_2O)xPO(ONH_{4+})y(OCH_2CH_2OH)z$, $C_nH_{2n+1}CH_2CH_2O(OCH_2CH_2OH)xH$, $C_nH_{2n+1}SO_2N(C_2H_5)(CH_2CH_2)xH$, $C_nH_{2n+1}CH_2CH_2OCH_2(OH)CH_2CH_2N(C_nH_{2n+1})_2$, $C_nH_{2n+1}CH_2CH_2OCH_2(OCH_2CH_2)_nCH_2CH_2N(C_nH_{2n+1})_2$, $C_nF_{2n+1}CH_2CH_2SO_3\_NH_{4+}$, $C_nF_{2n+1}CH_2CH_2SO_3H$, $(C_nF_{2n+1}CH_2CH_2O)xPO(ONH_{4+})y(OCH_2CH_2OH)z$, $C_nF_{2n+1}CH_2CH_2O(OCH_2CH_2OH)xH$, $C_nF_{2n+1}SO_2N(C_2H_5)(CH_2CH_2)xH$, $C_nF_{2n+1}CH_2CH_2OCH_2(OH)CH_2CH_2N(C_nF_{2n+1})_2$, and $C_nF_{2n+1}CH_2CH_2OCH_2(OCH_2CH_2)_nCH_2CH_2N(C_nF_{2n+1})_2$.

In the above chemical formula, n is an integer from 1 to 20, when x, y and z are present simultaneously, x, y and z are real numbers satisfying x+y+z=3, and when x is present alone, x is an integer of 1 to 3.

When the etching composition includes the surfactant, the etching composition may include 0.001 wt % to 0.1 wt % of the surfactant with respect to a total weight of the etching composition.

When the surfactant is less than 0.001 wt %, due to a relatively low surfactant content adsorbed onto the surface of the tantalum nitride film, its role of reducing an etch rate of the tantalum nitride film may be insufficient. Further, because it is difficult to reduce surface tension of the titanium nitride film, it may not be possible to effectively increase etch rate of the titanium nitride film.

When the surfactant exceeds 0.1 wt %, it is not economical to use an excess amount of surfactant because the resultant effects are same within the range mentioned above. Further, an excess amount of surfactant may generate excessive foams, resulting in a difficulty in utilization of the etching composition.

According to some example embodiments, the etching composition may further include a sequestering agent, etc.

For example, in the etching composition of the present disclosure, a ratio of weight of the acid compound to a weight of hydrogen peroxide may be 1 to 7. That is, in the etching composition of the present disclosure, a weight of the acid compound may be substantially the same as a weight of hydrogen peroxide, or a weight of the acid compound may be less than or equal to seven times the weight of hydrogen peroxide.

For another example, in the etching composition of the present disclosure, a weight of hydrogen peroxide may be greater than a weight of the acid compound.

In the etching composition according to some example embodiments, etch selectivity of the titanium nitride film to the tantalum nitride film may be equal to or greater than 500. For example, etch selectivity of the titanium nitride film to the tantalum nitride film may be equal to or greater than 1,000. For example, etch selectivity of the titanium nitride film to the tantalum nitride film may be from 1,500 to 5,000.

In one example, when the tantalum nitride film is removed by a thickness t and the titanium nitride film is removed by a thickness 2000t for the same duration of time, etch selectivity of the titanium nitride film to the tantalum nitride film may be 2000.

The etching composition according to some example embodiments may include a fluorine-containing compound or may not include the same.

For example, when the titanium nitride film is removed using the etching composition of the present disclosure in an environment where the oxide is exposed, the etching composition according to some example embodiments may not include the fluorine-containing compound.

For another example, when the titanium nitride film is removed using the etching composition of the present disclosure in an environment where the oxide is not exposed, the etching composition according to some example embodiments may include the fluorine-containing compound.

Although it is described above that exposure of the oxide determines whether or not the etching composition includes the fluorine-containing compound, the example embodiments are not limited hereto.

When wet etching is performed using the etching composition according to some example embodiments, wet etching temperature may be between 20° C. and 100° C., for example, although example embodiments are not limited hereto.

Following will explain the etching composition according to some example embodiments using experimental examples. However, the following experimental examples are provided only for the purpose of explanation, and the present disclosure is not limited hereto.

In the following experimental examples, the composition of the etching composition are expressed with wt % for clear representation of the relative amounts. Accordingly, one of ordinary skilled in the art who normally understands the present disclosure will be able to repeat and implement the experiments by properly adjusting a scale based on wt % amount suggested herein.

Following table represents composition of the etching composition included in the experimental examples, with etch rate of the titanium nitride film using the same, and etch rate of the tantalum nitride film. Further, the following table represents etch selectivity of the titanium nitride film with respect to the tantalum nitride film of the etching composition included in the experimental examples.

Experimental examples A to T represent the etching compositions according to some example embodiments, and Experimental examples U to AB represent comparative examples.

The compositions of the etching compositions are expressed with wt % of each component with respect to a total weight of the etching composition. The etching compositions of Experimental examples A to T include hydrogen peroxide, acid compound, corrosion inhibitor, and deionized water (DIW) as a remainder of the solvent.

Substrates formed with the titanium nitride film and the tantalum nitride film were immersed into the etching composition of Experimental examples A to AB. The substrate formed with the titanium nitride film was immersed into the etching composition for 30 seconds, and the substrate formed with the tantalum nitride film was immersed into the etching composition for 3 minutes.

To obtain etch rates of the titanium nitride film and the tantalum nitride film immersed in the etching composition, change in a film thickness was measured using Ellipsometer (SE-MG-1000). Using the change in the film thickness and the immersion time, etch rates of the titanium nitride film and the tantalum nitride film were determined. The unit of the etch rates of the titanium nitride film and the tantalum nitride film is Å/min. Etch selectivity of the titanium nitride film with respect to the tantalum nitride film was determined by dividing the etch rate of the titanium nitride film by the etch rate of the tantalum nitride film.

The unit of temperature for the evaluation of the wet etching performed for the evaluation of etch rates of the titanium nitride film and the tantalum nitride film using the etching composition of the experimental examples may be ° C.

The etch rate of the tantalum nitride film in Experimental examples A to T was marked less than 0.1 Å/min, because it exhibited an etch rate lower than a range that can be measured using the measurement equipment (i.e., Ellipsometer). However, for the sake of calculation of the etch selectivity in Experimental examples A to T, etch rate of the tantalum nitride film was given as 0.1 Å/min.

'3-ATZ' of the experimental examples represents '3-aminotriazole,' 'PG' represents 'propyl gallate', 'AN' represents 'ammonium nitrate,' 'APS' represents 'ammonium persulfate,' and 'TMAH' represents 'tetramethylammonium hydroxide.'

| Formulation | Composition | Temperature | Etching Rate TiN | Etching Rate TaN | Selectivity TiN/TaN |
|---|---|---|---|---|---|
| A | 20 wt % hydrogen peroxide, 30 wt % phosphoric acid, 2 wt % 3-ATZ, 48 wt % DIW | 70 | 275 | <0.1 | 2750 |
| B | 20 wt % hydrogen peroxide, 30 wt % phosphoric acid, 2 wt % PG, 48 wt % DIW | 70 | 260 | <0.1 | 2600 |
| C | 20 wt % hydrogen peroxide, 30 wt % phosphoric acid, 2 wt % AN, 48 wt % DIW | 70 | 248 | <0.1 | 2480 |
| D | 20 wt % hydrogen peroxide, 30 wt % phosphoric acid, 2 wt % APS, 48 wt % DIW | 70 | 282 | <0.1 | 2820 |
| E | 25 wt % hydrogen peroxide, 15 wt % phosphoric acid, 2 wt % APS, 58 wt % DIW | 70 | 300 | <0.1 | 3000 |
| F | 12 wt % hydrogen peroxide, 50 wt % phosphoric acid, 2 wt % APS, 36 wt % DIW | 70 | 200 | <0.1 | 2000 |
| G | 20 wt % hydrogen peroxide, 20 wt % phosphoric acid, 2 wt % APS, 58 wt % DIW | 70 | 225 | <0.1 | 2250 |
| H | 20 wt % hydrogen peroxide, 40 wt % phosphoric acid, 2 wt % APS, 38 wt % DIW | 70 | 285 | <0.1 | 2850 |
| I | 15 wt % hydrogen peroxide, 30 wt % phosphoric acid, 2 wt % APS, 53 wt % DIW | 70 | 254 | <0.1 | 2540 |
| J | 25 wt % hydrogen peroxide, 30 wt % phosphoric acid, 2 wt % APS, 43 wt % DIW | 70 | 326 | <0.1 | 3260 |
| K | 20 wt % hydrogen peroxide, 50 wt % phosphoric acid, 2 wt % APS, 28 wt % DIW | 70 | 336 | <0.1 | 3360 |
| L | 5 wt % hydrogen peroxide, 30 wt % phosphoric acid, 2 wt % APS, 63 wt % DIW | 70 | 50 | <0.1 | 500 |
| M | 10 wt % hydrogen peroxide, 30 wt % phosphoric acid, 2 wt % APS, 58 wt % DIW | 10 | 130 | <0.1 | 1300 |
| N | 5 wt % hydrogen peroxide, 30 wt % acetic acid, 2 wt % APS, 63 wt % DIW | 70 | 39 | <0.1 | 390 |
| P | 15 wt % hydrogen peroxide, 30 wt % acetic acid, 2 wt % APS, 53 wt % DIW | 70 | 141 | <0.1 | 1410 |
| Q | 20 wt % hydrogen peroxide, 30 wt % acetic acid, 2 wt % APS, 48 wt % DIW | 70 | 150 | <0.1 | 1500 |
| R | 25 wt % hydrogen peroxide, 30 wt % acetic acid, 2 wt % APS, 43 wt % DIW | 70 | 181 | <0.1 | 1810 |
| S | 20 wt % hydrogen peroxide, 30 wt % phosphoric acid, 2 wt % nitric acid, 2 wt % APS, 46 wt % DIW | 70 | 288 | <0.1 | 2880 |
| T | 20 wt % hydrogen peroxide, 30 wt % phosphoric acid, 3 wt % nitric acid, 2 wt % APS, 45 wt % DIW | 70 | 320 | <0.1 | 3200 |

-continued

| Formulation | Composition | Temperature | Etching Rate TiN | TaN | Selectivity TiN/TaN |
|---|---|---|---|---|---|
| U | 25 wt % hydrogen peroxide, 75 wt % DIW | 70 | 150 | 1.4 | 107 |
| V | 31 wt % hydrogen peroxide, 69 wt % DIW | 70 | 366 | 2.4 | 153 |
| W | 25 wt % hydrogen peroxide, 2 wt % TMAH, 0.2 wt % hydrazine, 72.8 wt % DIW | 50 | 264 | 3.3 | 79 |
| X | 25 wt % hydrogen peroxide, 2 wt % hydrazine, 73 wt % DIW | 50 | 330 | 3.3 | 99 |
| Y | 20 wt % hydrogen peroxide, 30 wt % sulfuric acid, 2 wt % APS, 48 wt % DIW | 70 | 398 | 3.3 | 121 |
| Z | 25 wt % hydrogen peroxide, 1 wt % NH4OH, 74 wt % DIW | 50 | 266 | 5.8 | 46 |
| AA | 50 wt % nitric acid, 0.1 wt % HF, 49.9 wt % DIW | 50 | 107 | 5.1 | 21 |
| AB | 20 wt % hydrogen peroxide, 10 wt % phosphoric acid, 2 wt % APS, 68 wt % DIW | 70 | 180 | 0.7 | 257 |

In the experimental example using hydrogen peroxide only or using TMAH instead of acid compound according to some example embodiments, it was observed that the tantalum nitride film was etched and damaged. Accordingly, it was confirmed that etch selectivity of the titanium nitride film with respect to the tantalum nitride film was also deteriorated.

In experimental examples A to T including the etching compositions according to some example embodiments, it was observed that the etch rate of the tantalum nitride film was low, and accordingly, damage of the tantalum nitride film was low. Accordingly, it was confirmed that the etch selectivity of the titanium nitride film with respect to the tantalum nitride film was relatively high.

A method for fabricating a semiconductor device using the etching composition according to some example embodiments describes a multi-channel transistor including multi-channel (e.g., fin-type transistor (FinFET)) including a fin-type pattern of a channel region, a transistor including nanowire, and a transistor including a nanosheet), but a planar transistor may be also implemented.

Further, the method for fabricating the semiconductor device using the etching composition according to some example embodiments describes fabrication of the transistor, but the method may be also applied to fabrication of wires in a back-end-of-line (BEOL) process connected to the transistor.

Figure 3:
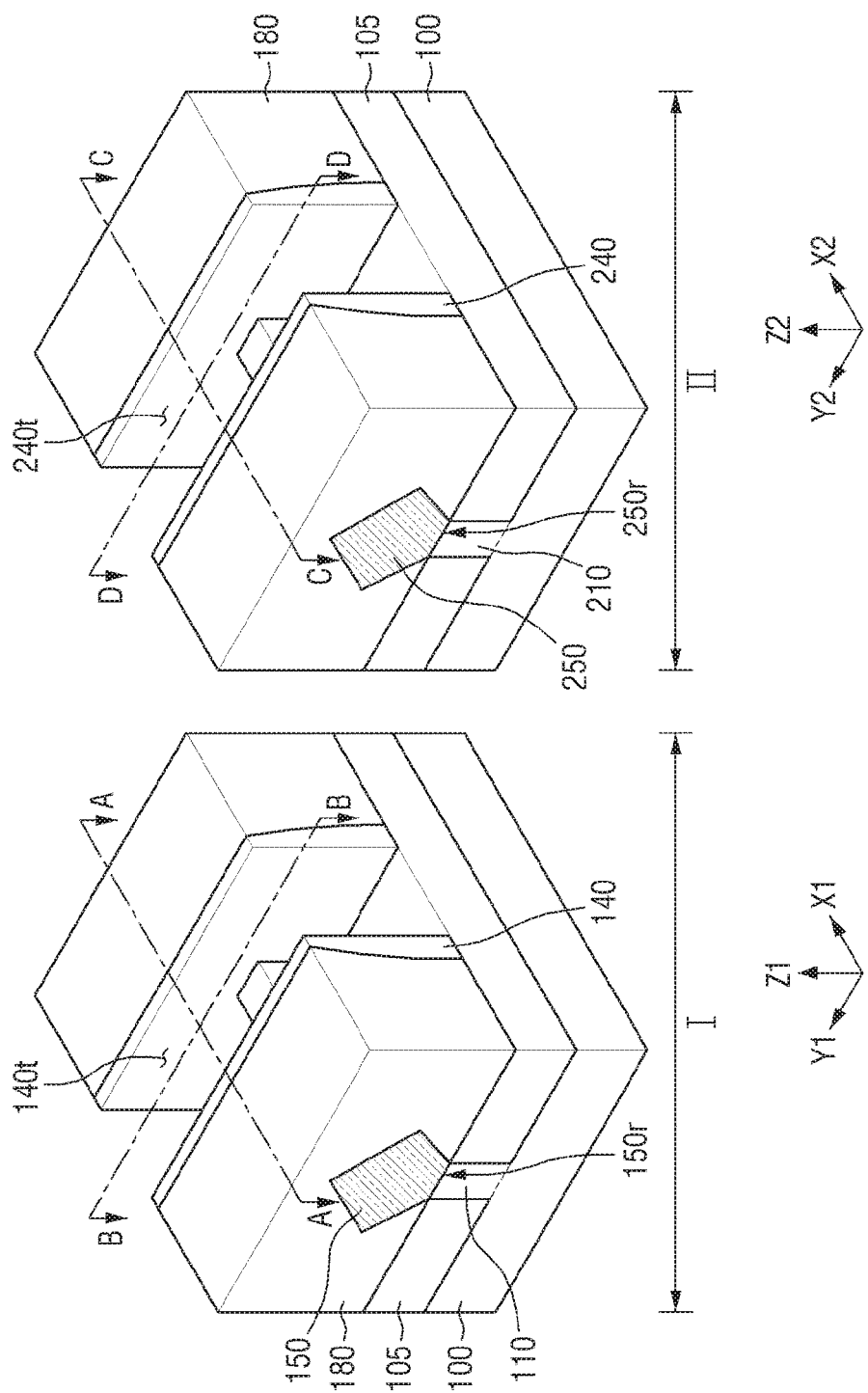
Figure 4:
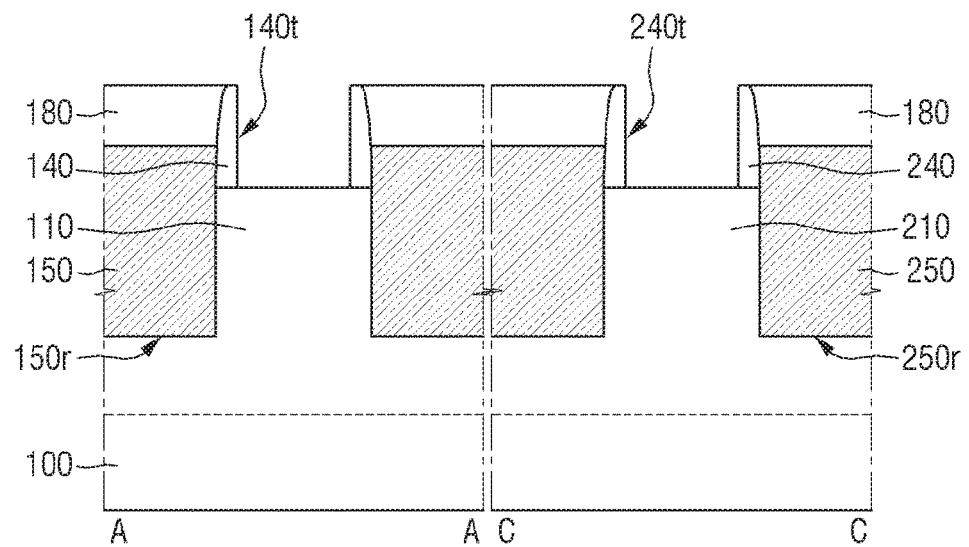
Figure 5:
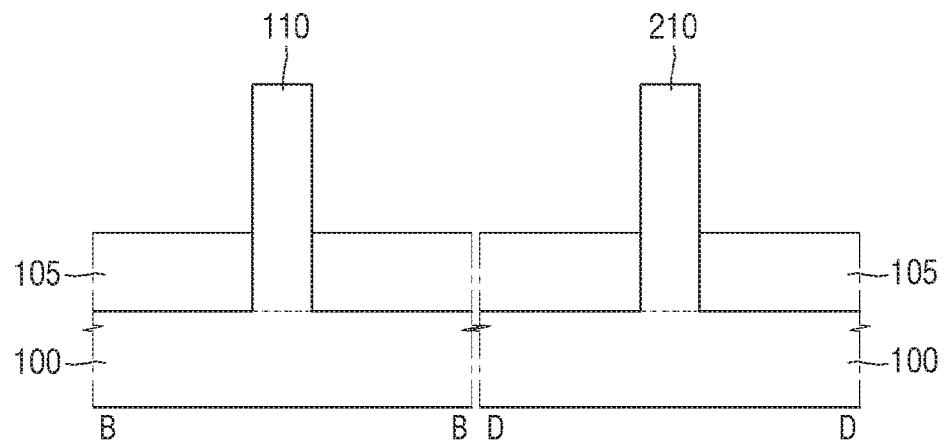

FIGS. 1 to 14 are views illustrating intermediate stages of fabrication illustrating a method for fabricating a semiconductor device using an etching composition according to some example embodiments of present disclosure. FIG. 4 is a cross sectional view taken on lines A-A and C-C of FIG. 3, and FIG. 5 is a cross sectional view taken on lines B-B and D-D of FIG. 3.

Referring to FIG. 1, a first fin-type pattern 110 and a second fin-type pattern 210 may be formed on the substrate 100. The first fin-type pattern 110 may be formed in a first region I, and the second fin-type pattern 210 may be formed in a second region II.

The substrate 100 may include the first region I and the second region II. The first region I and the second region II may be the regions spaced apart from each other, or regions connected to each other. Further, the transistor formed in the first region I may have the same, or different conductivity type as that of the transistor formed in the second region II.

The substrate 100 may be a bulk silicon or a silicon-on-insulator (SOI). Alternatively, the substrate 100 may be a silicon substrate, or may include other materials such as silicon germanium, silicon germanium on insulator (SGOI), indium antimonide, lead telluride, indium arsenide, indium phosphide, gallium arsenide, or gallium antimonide, but limited not hereto.

The first fin-type pattern 110 may be elongated in a first direction X1, and the second fin-type pattern 210 may be elongated in a second direction X2. The first fin-type pattern 110 and the second fin-type pattern 210 may be a part of the substrate 100, and may include an epitaxial layer grown from the substrate 100.

The first fin-type pattern 110 and the second fin-type pattern 210 may each include, for example, an element semiconductor material such as silicon or germanium. Further, the first fin-type pattern 110 may include a compound semiconductor such as IV-IV group compound semiconductor or group compound semiconductor. Specifically, take the IV-IV group compound semiconductor as an example, the first fin-type pattern 110 and the second fin-type pattern 210 may be a binary compound or a ternary compound including at least two or more of carbon (C), silicon (Si), germanium (Ge) and tin (Sn), or these compounds doped with IV group element. Take the III-V group compound semiconductor as an example, the first fin-type pattern 110 and the second fin-type pattern 210 may be one of a binary compound, a ternary compound or a quaternary compound which is formed by a combination of a III group element, which may be at least one of aluminum (Al), gallium (Ga), or indium (In), and a V group element, which may be one of phosphorus (P), arsenic (As) and antimony (Sb).

In the semiconductor device according to some example embodiments, it is assumed that the first fin-type pattern 110 and the second fin-type pattern 210 are silicon fin-type patterns including silicon.

A field insulating film 105 may be formed on the substrate 100. The field insulating film 105 may partially overlie the first fin-type pattern 110 and the second fin-type pattern 210. For example, the field insulating film 105 may partially overlie side-walls of the first fin-type pattern 110 and the second fin-type pattern 210. An upper surface of the first fin-type pattern 110 and an upper surface of the second fin-type pattern 210 may protrude upward higher than an upper surface of the field insulating film 105 formed adjacent to longer sides of the first fin-type pattern 110 and the second fin-type pattern 210. The first fin-type pattern 110 and the second fin-type pattern 210 may be defined by the field insulating film 105 on the substrate 100. For example, the field insulating film 105 may include at least one of a silicon oxide film, a silicon nitride film, or a silicon oxynitride film.

Further, the field insulating film 105 may additionally include at least one or more field liner films formed between the first fin-type pattern 110 and the field insulating film 105 and between the second fin-type pattern 210 and the field insulating film 105. When the field insulating film 105 further includes the field liner film, the field liner film may include at least one of polysilicon, amorphous silicon, silicon oxynitride, silicon nitride, or silicon oxide.

Figure 2:
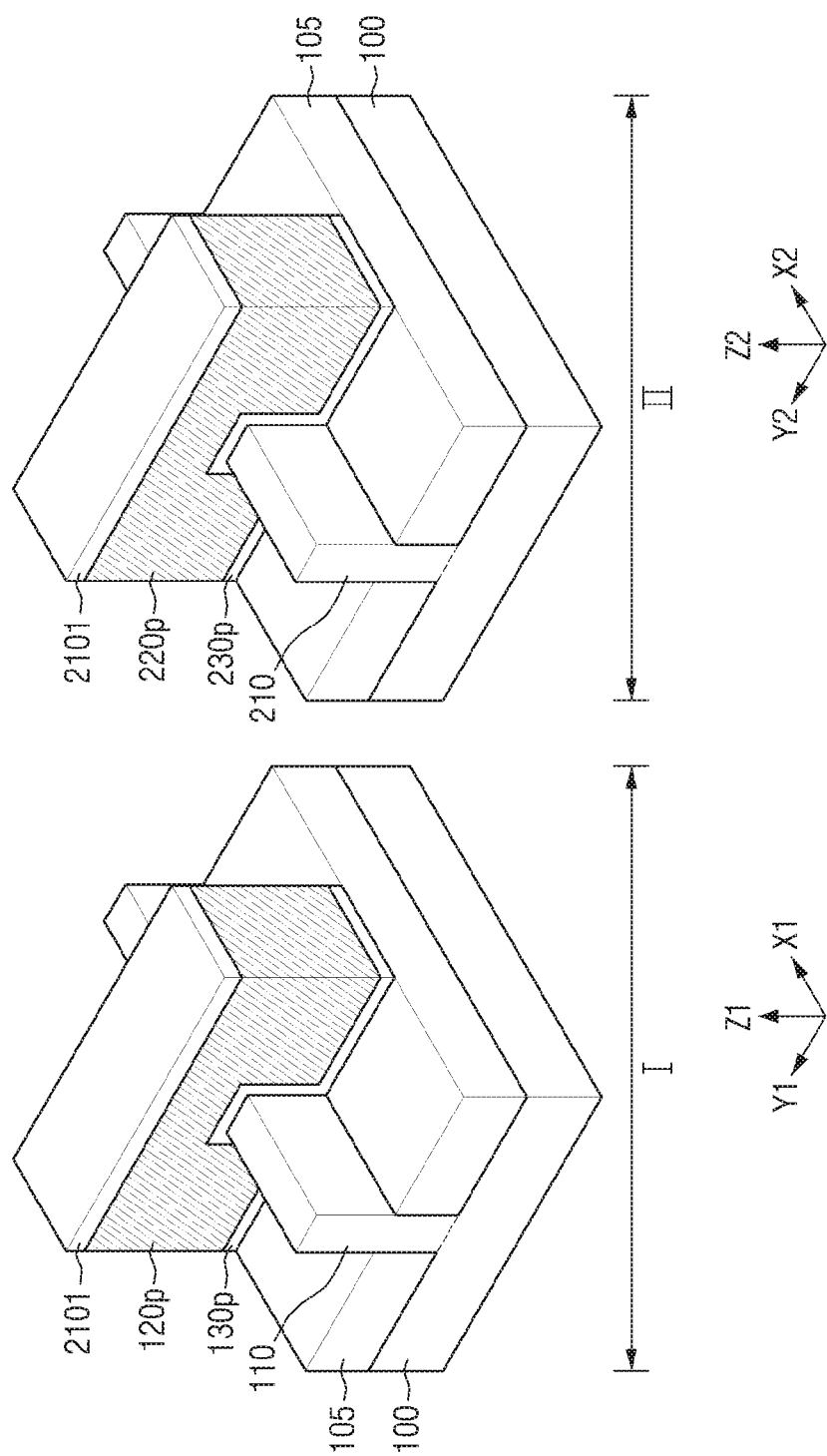

Referring to FIG. 2, etching process may be performed using a gate hard mask pattern 2101, such that a first dummy gate electrode 120p extending in a third direction Y1 by intersecting the first fin-type pattern 110, and a second dummy gate electrode 220p extending in a fourth direction Y2 by intersecting the second fin-type pattern 210 are formed.

A first dummy gate insulating film 130p may be formed between the first fin-type pattern 110 and the first dummy gate electrode 120p, and a second dummy gate insulating film 230p may be formed between the second fin-type pattern 210 and the second dummy gate electrode 220p.

The first dummy gate insulating film 130p and the second dummy gate insulating film 230p may include, for example, one of a silicon oxide ($SiO_2$) film, a silicon oxynitride (SiON) film, and a combination thereof.

The first dummy gate electrode 120p and the second dummy gate electrode 220p may in example, polycrystalline silicon (poly Si), amorphous silicon (a-Si), and a combination thereof. The first dummy gate electrode 120p and the second dummy gate electrode 220p may not be doped with impurities, or may be doped with similar impurities. Different from the above description, one may be doped, and the other may not be doped. Alternatively, one may be doped with an n-type material (e.g., arsenic, phosphorous or other n-type materials), and the other may be doped with a p-type material (e.g., boron or other p-type materials).

Referring to FIGS. 3 to 5, a first trench 140t intersecting the first fin-type pattern 110 may be formed by removing the first dummy gate electrode 120p and the first dummy gate insulating film 130p. Further, by removing the second dummy gate electrode 220p and the second dummy gate insulating film 230p, a second trench 240t intersecting the second fin-type pattern 210 may be formed. On the field insulating film 105, an interlayer insulating film 180 including the first trench 140t and the second trench 240t may be formed.

More specifically, a first gate spacer 140 and a second gate spacer 240 may be respectively formed on sidewalls of the first dummy gate electrode 120p and the second dummy gate electrode 220p.

A first recess 150r may be formed by removing a portion of the first fin-type pattern 110 which does not overlap with the first dummy gate electrode 120p when the first gate spacer 140 is formed. Further, a second recess 250r may be formed by removing a portion of the second fin-type pattern 210 which does not overlap with the second dummy gate electrode 220p when the second gate spacer 240 is formed.

A first epitaxial pattern 150 for filling the first recess 150r may then be formed on both sides of the first dummy gate electrode 120p. The first epitaxial pattern 150 may be included in a source/drain of the transistor which uses the first fin-type pattern 110 as the channel region. A second epitaxial pattern 250 for filling the second recess 250r may be formed on both sides of the second dummy gate electrode 220p. The second epitaxial pattern 250 may be included in the source/drain of the transistor which uses the second fin-type pattern 210 as the channel region.

The interlayer insulating film 180 may then be formed, to overlie e first epitaxial pattern 150 and the second epitaxial pattern 250. Through planarization process, upper surfaces of the first dummy gate electrode 120p and the second dummy gate electrode 220p may be exposed.

For example, the interlayer insulating film 180 may include silicon oxide, silicon nitride, silicon oxynitride, flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited hereto.

The first trench 140t may be formed in the first region I and the second trench 240t may be formed in the second region II, by removing the first dummy gate electrode 120p and the first dummy gate insulating film 130p, and removing the second dummy gate electrode 220p and the second dummy gate insulating film 230p.

The following will be described based on cross sectional views taken on lines A-A and C-C of FIG. 3, and cross sectional views taken on lines B-B and D-D of FIG. 3.

Figure 6:
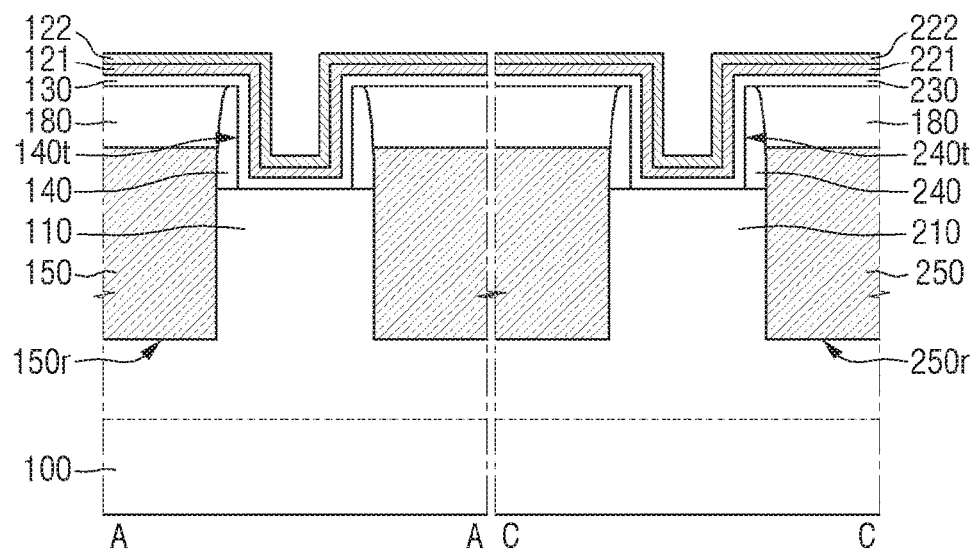
Figure 7:
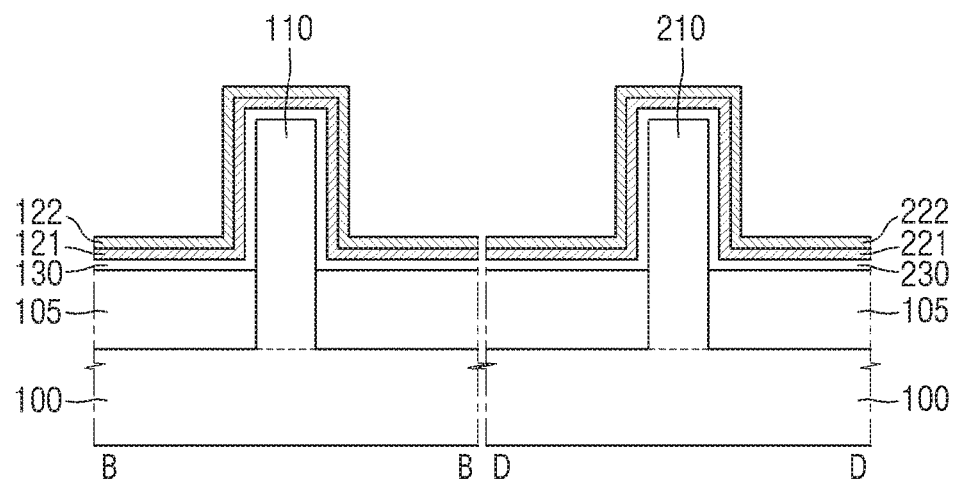

Referring to FIGS. 6 and 7, a first gate insulating film 130 may be formed along a side-wall and a bottom surface of the first trench 140t and an upper surface of the interlayer insulating film 180. Further, a second gate insulating film 230 may be formed along a side-wall and a bottom surface of the second trench 240t and an upper surface of the interlayer insulating film 180.

The first gate insulating film 130 may be formed along a profile of the first fin-type pattern 110 protruding upward in a vertical direction higher than an upper surface of the field insulating film 105, and along an upper surface of the field insulating film 105. The second gate insulating film 230 may be formed along a profile of the second fin-type pattern 210 protruding upward in a vertical direction higher than an upper surface of the field insulating film 105, and along an upper surface of the field insulating film 105.

The first gate insulating film 130 and the second gate insulating film 230 may respectively include a high-k dielectric material having a higher dielectric constant than a silicon oxide film. For example, each of the first gate insulating film 130 and the second gate insulating film 230 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Unlike the illustration in FIGS. 6 and 7, an interfacial film may be additionally formed between the first gate insulating film 130 and the first fin-type pattern 110, and between the second gate insulating film 230 and the second fin-type pattern 210. When the first fin-type pattern 110 and the second fin-type pattern 210 are silicon fin-type patterns, the interfacial layer may include silicon oxide, for example.

A first TaN film 121 may be formed on the first gate insulating film 130. The first TaN film 121 may be formed along a profile of the first gate insulating film 130. The first TaN film 121 may be formed on a sidewall and a bottom surface of the first trench 140t and an upper surface of the interlayer insulating film 180. The first TaN film 121 may be formed along the profile of the first fin-type pattern 110 protruding upward in a vertical direction higher than the upper surface of the field insulating film 105, and along the upper surface of the field insulating film 105.

A second TaN film 221 may be formed on the second gate insulating film 230. The second TaN film 221 may be formed along a profile of the second gate insulating film 230. The second TaN film 221 may be formed on a side-wall and a bottom surface of the second trench 240t, and an upper surface of the interlayer insulating film 180. The second TaN film 221 may be formed along the profile of the second fin-type pattern 210 protruding upward in a vertical direction higher than the upper surface of the field insulating film 105, and along the upper surface of the field insulating film 105.

A first TiN film 122 may be formed on the first TaN film 121. The first TiN film 122 may be formed along a profile of the first TaN film 121. The first TiN film 122 may be formed on a side-wall and a bottom surface of the first trench 140t and an upper surface of the interlayer insulating film 180. The first TiN film 122 may be formed along the profile of the first fin-type pattern 110 protruding upward in a vertical direction higher than the upper surface of the field insulating film 105, and along the upper surface of the field insulating film 105.

A second TiN film 222 may be formed on the second TaN film 221. The second TiN film 222 may be formed along a profile of the second TaN film 221. The second TiN film 222 may be formed on a sidewall and a bottom surface of the second trench 240t, and an upper surface of the interlayer insulating film 180. The second TiN film 222 may be formed along a profile of the second fin-type pattern 210 protruding upward in a vertical direction higher than the upper surface of the field insulating film 105, and along the upper surface of the field insulating film 105.

Figure 8:
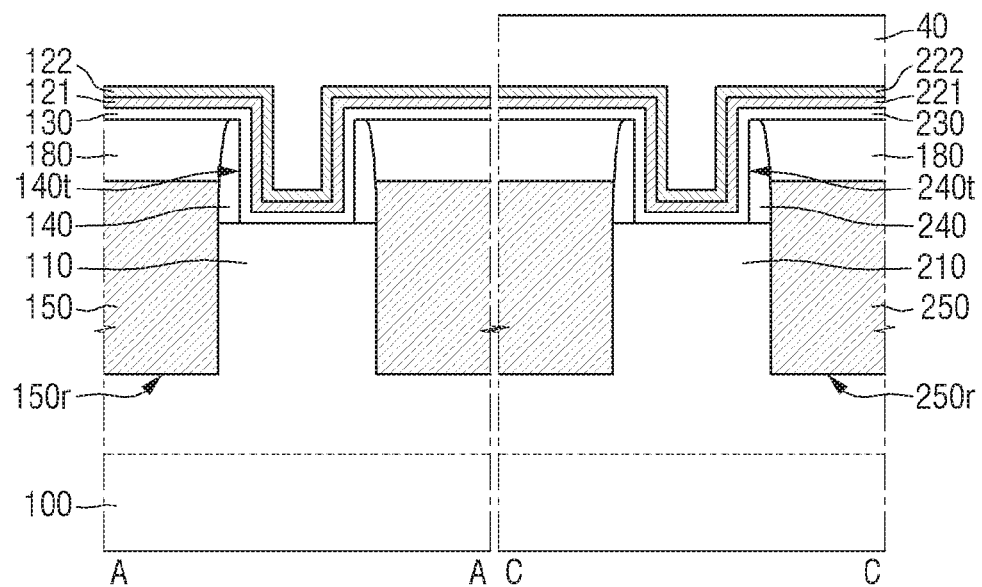
Figure 9:
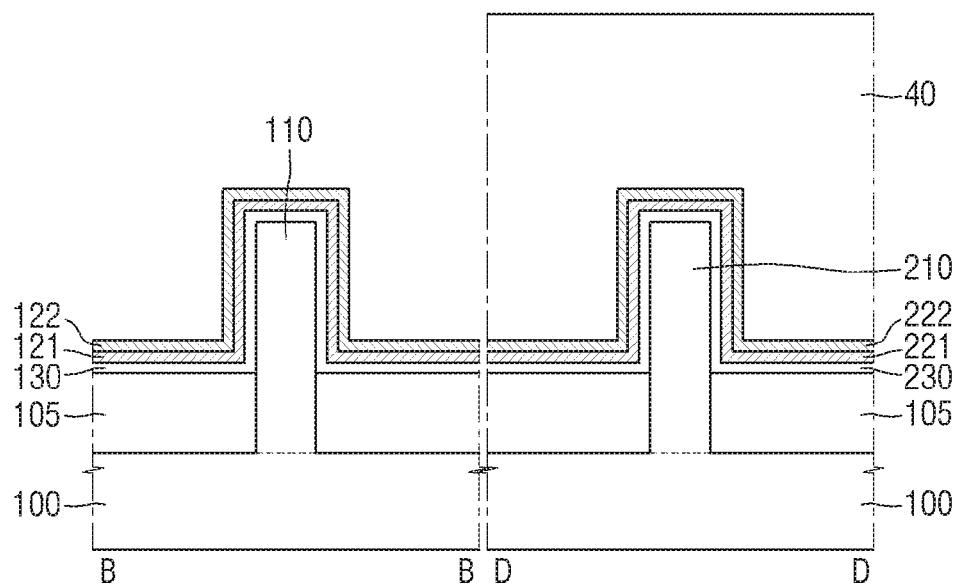

Referring to FIGS. 8 and 9, a mask pattern 40 may be formed on the second TiN film 222.

Because the mask pattern 40 may be formed on the second region II and not formed on the first region I, the first TiN film 122 may be exposed by the mask pattern 40. In other words, the mask pattern 40 may cover the second TiN film 222 and may not cover the first TiN film 122.

Although the mask pattern 40 is illustrated as a single-layered film, this is provided only for convenience of explanation and example embodiments are not limited hereto.

Figure 10:
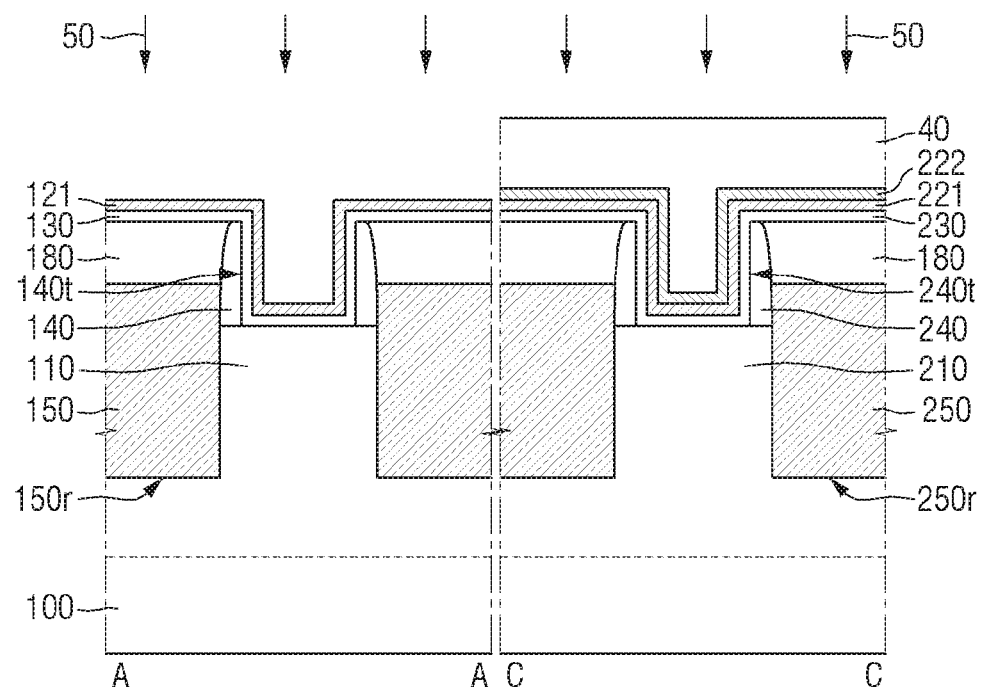
Figure 11:
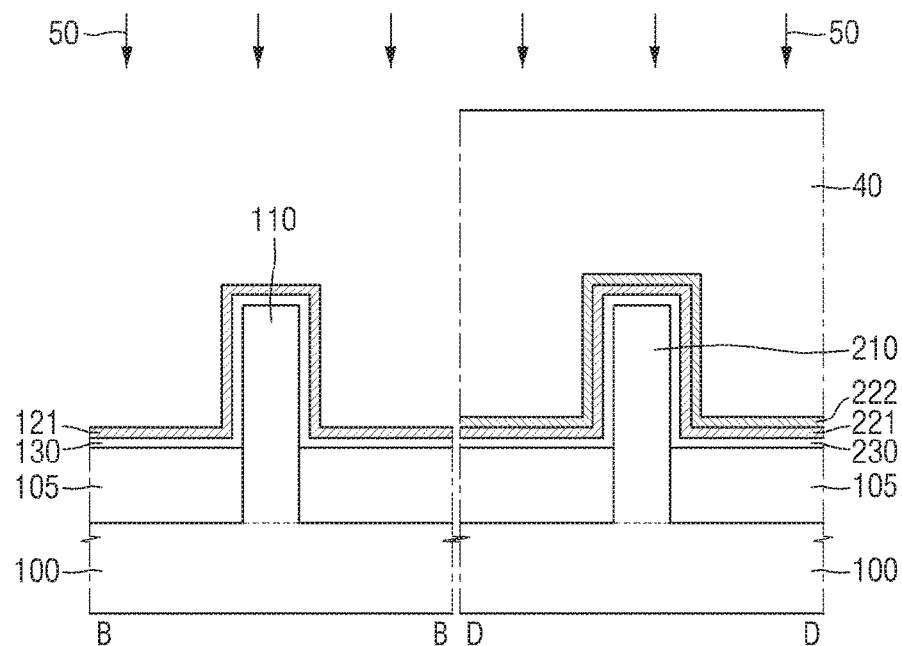

Referring to FIGS. 10 and 11, the first TiN film 122 may be removed using the mask pattern 40 with wet etching.

The wet etching 50 may be performed using the etching composition according to some example embodiments described above.

For example, the first TaN film 121 may be exposed with removal of the first TiN film 122, but not limited hereto.

In other words, unlike illustration, a portion of the first TiN film 122 may be removed by adjusting a duration of time of the wet etching. Through the above, the rest portion of the first TiN film 122 may remain on the first TaN film 121.

The mask pattern 40 on the second region II may then be removed.

Figure 12:
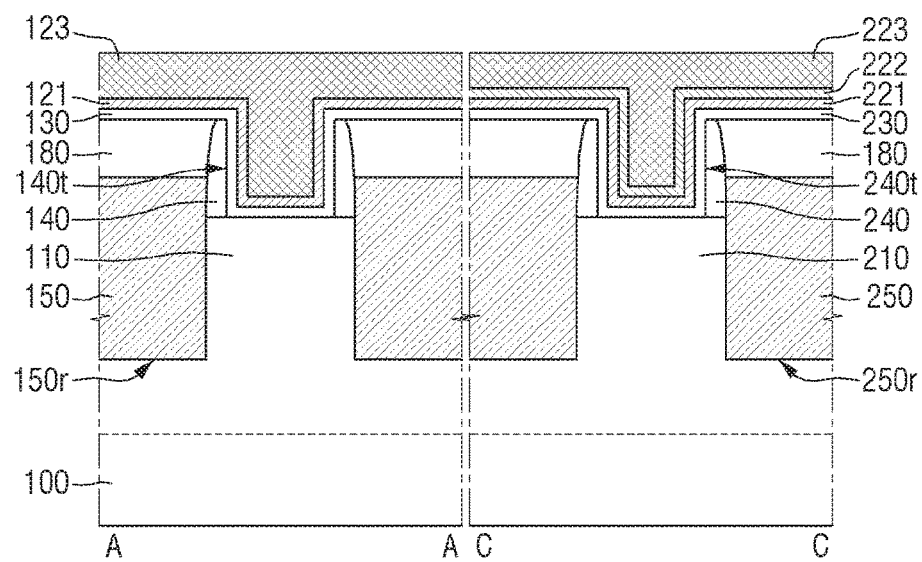
Figure 13:
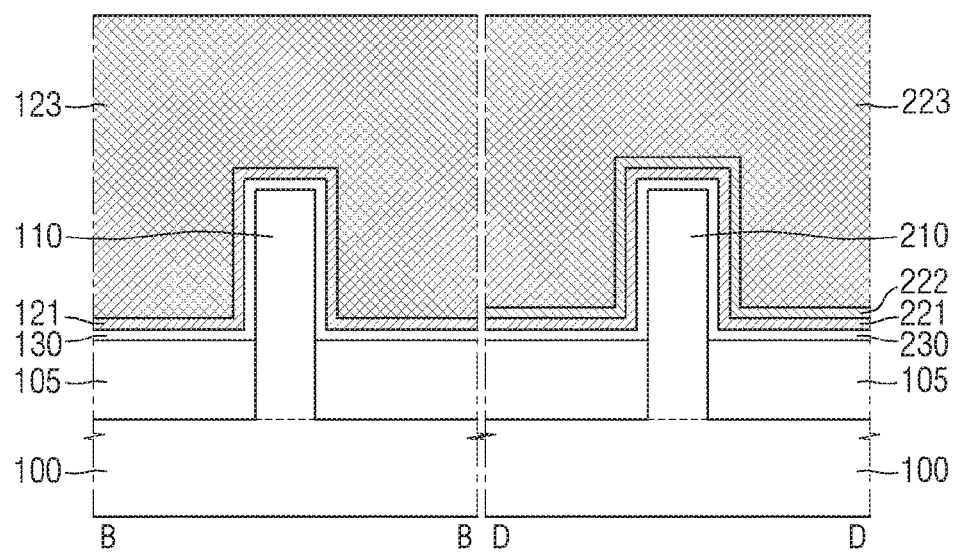

Referring to FIGS. 12 and 13, a first upper electrode film 123 may be formed on the first TaN film 121, and a second upper electrode film 223 may be formed on the second TiN film 222.

The first upper electrode film 123 may be formed on the upper surface of the interlayer insulating film 180, while filling the first trench 140t. The second upper electrode film 223 may be formed on the upper surface of the interlayer insulating film 180, while filling the second trench 240t.

The first upper electrode film 123 and the second upper electrode film 223 may respectively include at least one of, for example, titanium nitride (TiN), tantalum carbide (TaC), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

Figure 14:
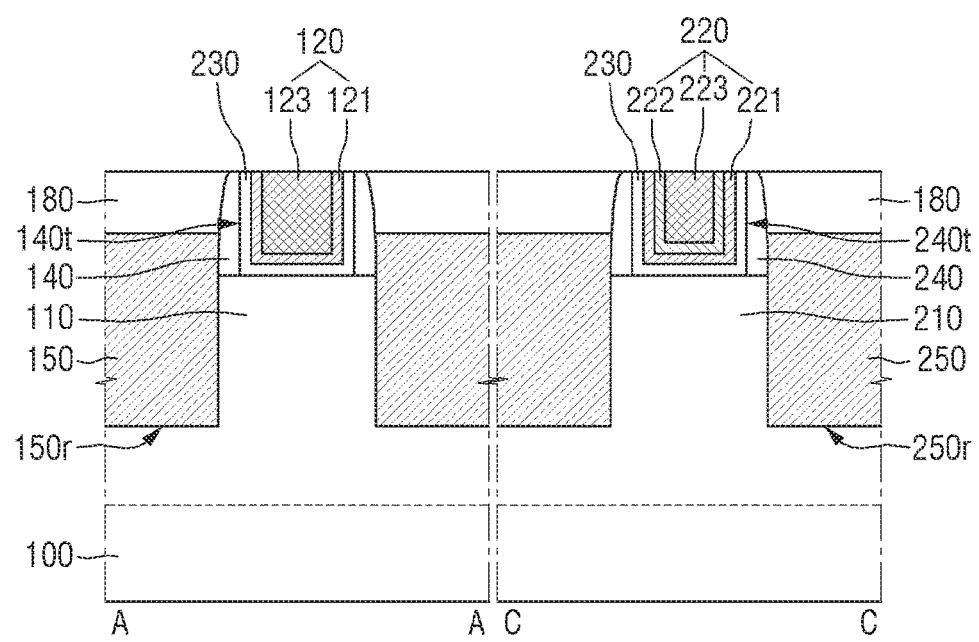

Referring to FIG. 14, a first gate electrode 120 may be formed within the first trench 140t by removing the first gate insulating film 130, the first TaN film 121, and the first upper electrode film 123, which are formed on the interlayer insulating film 180.

A second gate electrode 220 may be formed within the second trench 240t by removing the second gate insulating film 230, the second TaN film 221, the second TiN film 222, and the second upper electrode film 223, which are formed on the upper surface of the interlayer insulating film 180.

The first gate electrode 120 may include the first TaN film 121 and the first upper electrode film 123, and the second gate electrode 220 may include the second TaN film 222, the second TiN film 222, and the second upper electrode film 223.

Figure 15:
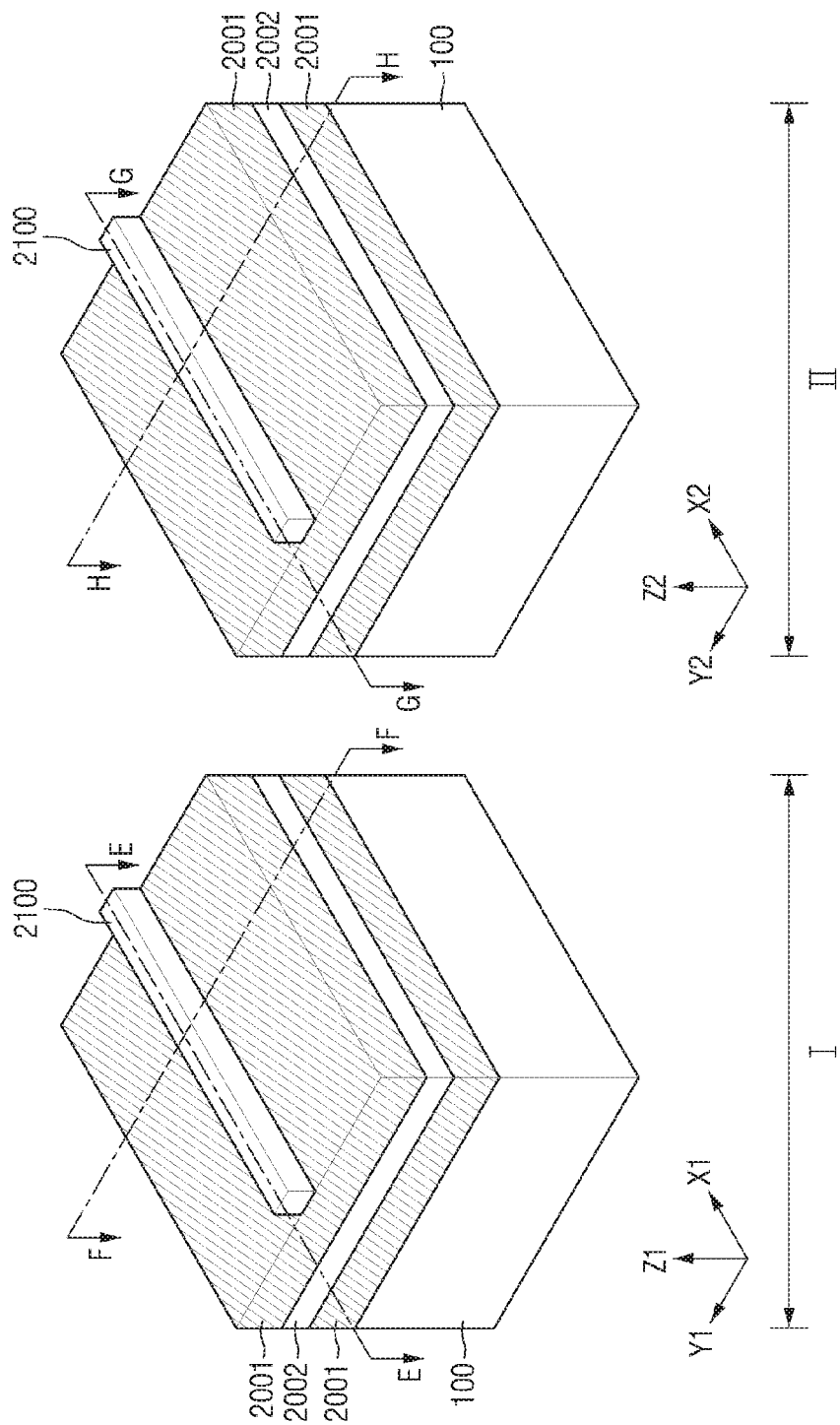
FIGS. 15 to 25 are views illustrating intermediate stages of fabrication illustrating a method for fabricating a semiconductor device by using an etching composition according to some example embodiments of the present disclosure.
Figure 16:
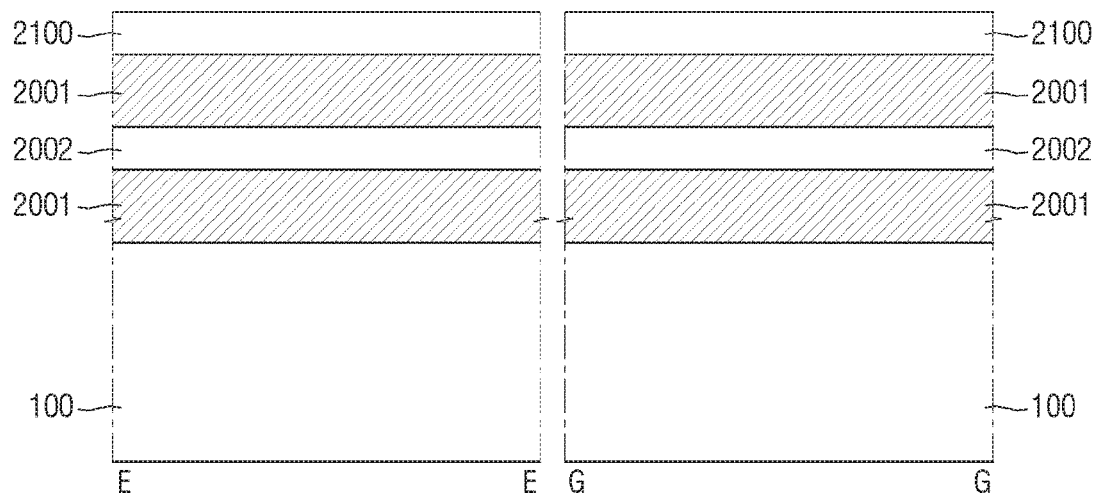
Figure 17:
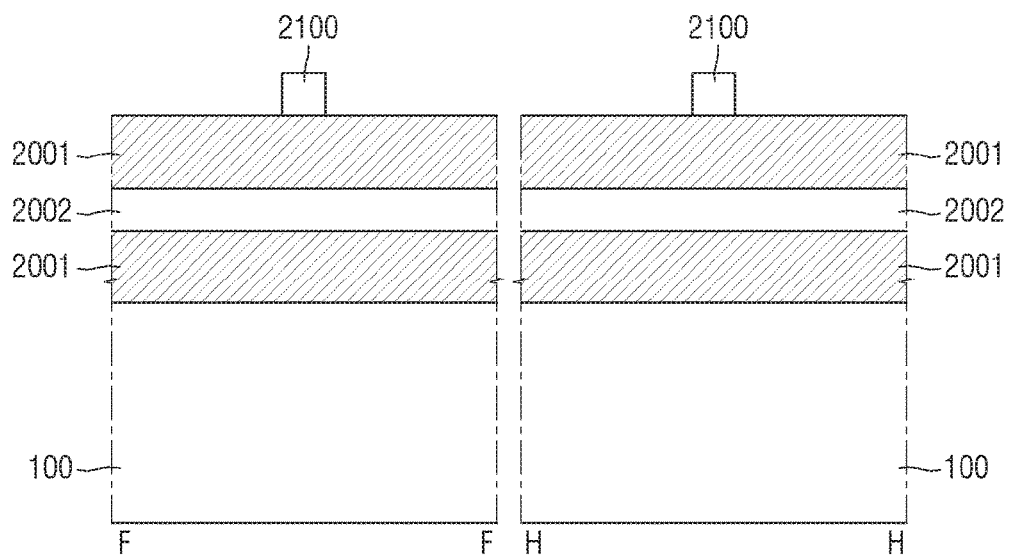

FIGS. 15 to 25 are views illustrating intermediate stages of fabrication illustrating a method for fabricating a semiconductor device using an etching composition according to some example embodiments of present disclosure. FIG. 16 is a cross sectional view taken on lines E-E and G-G of FIG. 15, and FIG. 17 is a cross sectional view taken on lines F-F and H-H of FIG. 15.

Referring to FIGS. 15 to 17, a sacrificial film 2001 and an active film 2002 may be sequentially formed on the substrate 100 including the first region I and the second region II. The sacrificial film 2001 and the active film 2002 may be formed using, for example, an epitaxial growth method.

The active film 2002 may contain a material having etch selectivity with respect to the sacrificial film 2001.

In FIG. 15, it is illustrated that the active film 2002 is a single-layered film and the sacrificial film 2001 is a double-layered film, but this is just for convenience sake, and example embodiments are not limited hereto. Further, although it is illustrated that the sacrificial film 2001 is positioned on the uppermost portion, example embodiments are not limited hereto.

Then, on the sacrificial film 2001 of the first region I and the second region II a structure mask pattern 2100 may be formed respectively.

In the first region I, the structure mask pattern 2100 may extend longitudinally in the first direction X1. In the second region II, the structure mask pattern 2100 may extend longitudinally in the second direction X2.

Following will be explained based on cross sectional views taken on lines E-E and G-G of FIG. 15, and a cross sectional views taken on lines F-F and H-H of FIG. 15.

Figure 18:
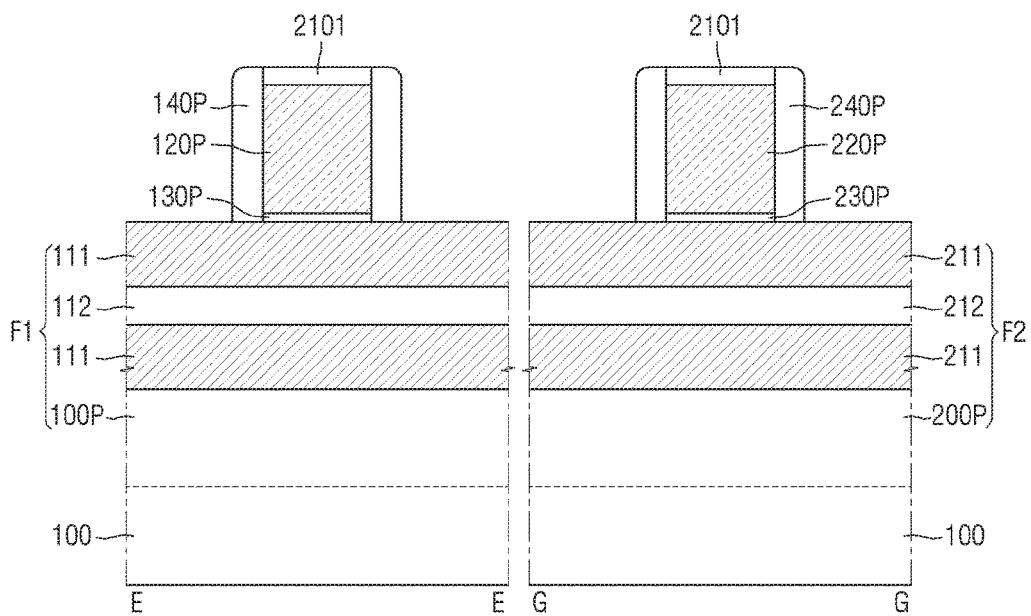
Figure 19:
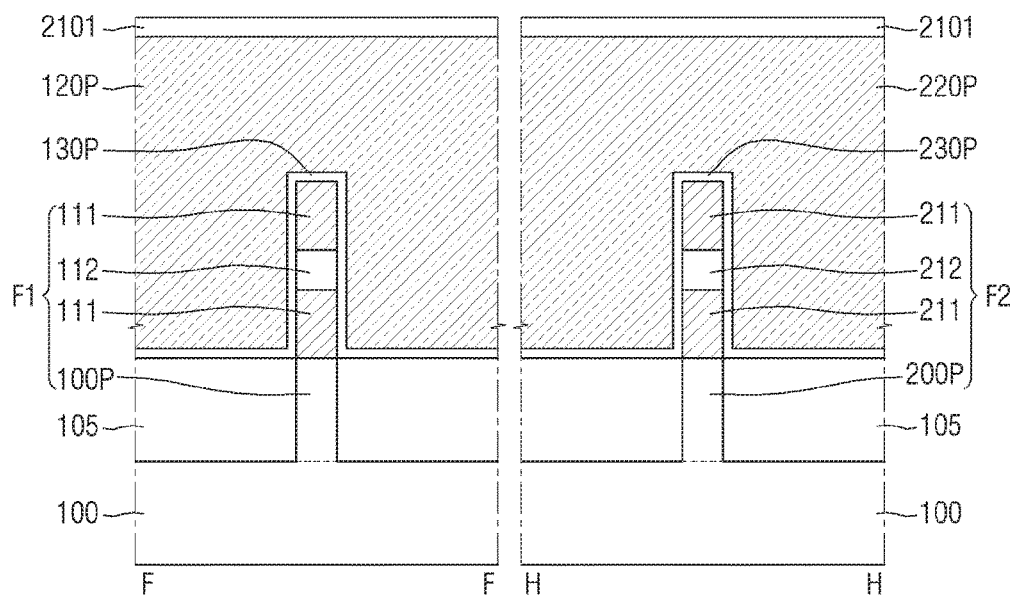

Referring to FIGS. 18 and 19, an etching process may be performed with the structure mask pattern 2100 as mask so as to form a first fin-type structure F1 and a second fin-type structure F2.

The first fin-type structure F1 may be formed in the first region I. The first fin-type structure F1 may include a first fin-type protrusion 100P, a first sacrificial pattern 111, a first active pattern 112, and a first sacrificial pattern 111, which are layered on the substrate 100 in a sequential order.

The second fin-type structure F2 may be formed in the second region I. The second fin-type structure F2 may include a second fin-type protrusion 200P, a second sacrificial pattern 211, a second active pattern 212, and a second sacrificial pattern 211, which are layered on the substrate 100 in a sequential order.

In FIG. 19, it is illustrated that all e sacrificial films on the substrate 100 are removed except for the sacrificial films 2001 used to form the first fin-type structure F1 and the second fin-type structure F2, but this is just for convenience sake, and example embodiments are not limited hereto.

Then, the field insulating film 105 to overlie at least a portion of a sidewall of the first fin-type structure F1 and a sidewall of the second fin-type structure F2 may be formed on the substrate 100.

In a process of forming the field insulating film 105, the structure mask pattern 2100 may be removed.

Then, in the first region I, the first dummy gate electrode 120p, intersecting the first fin-type structure F1 and extending in the third direction Y1, may be formed.

Further, in the second region II, the second dummy gate electrode 220p, intersecting the second fin-type structure F2 and extending in the fourth direction Y2, may be formed.

The first dummy gate electrode 120p and the second dummy gate electrode 220p may be formed using the gate hard mask pattern 2101.

The first dummy gate insulating film 130p and the second dummy gate insulating film 230p may be formed respectively between the first dummy gate electrode 120p and the first fin-type structure F1 and between the second dummy gate electrode 220p and the second fin-type structure F2.

On a side-wall of the first dummy gate electrode 120p, a first pre-gate spacer 140p may be formed. On a sidewall of the second dummy gate electrode 220p, a second pre-gate spacer 240p may be formed.

Figure 20:
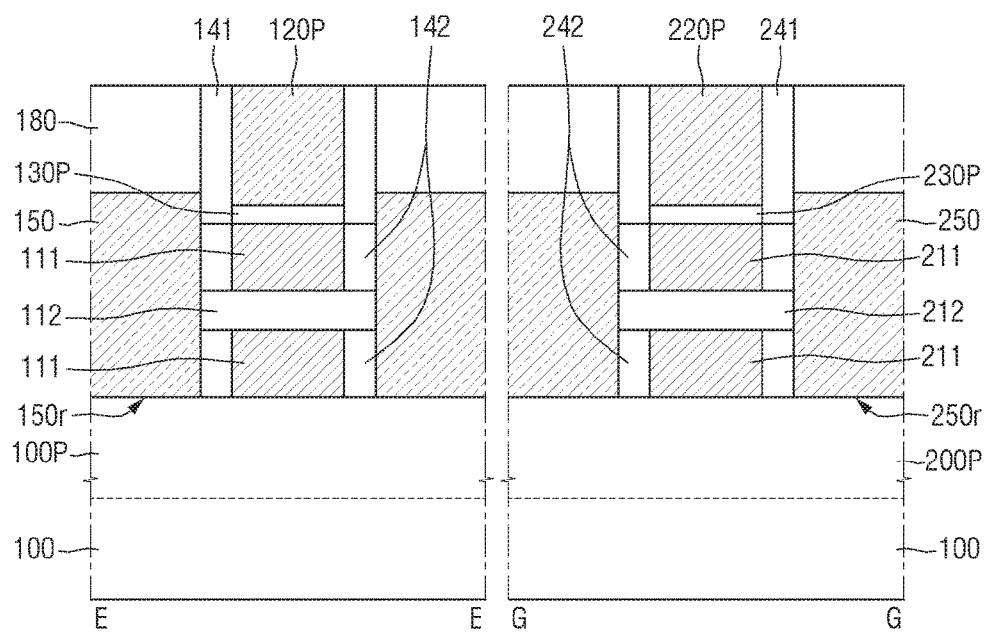
Figure 21:
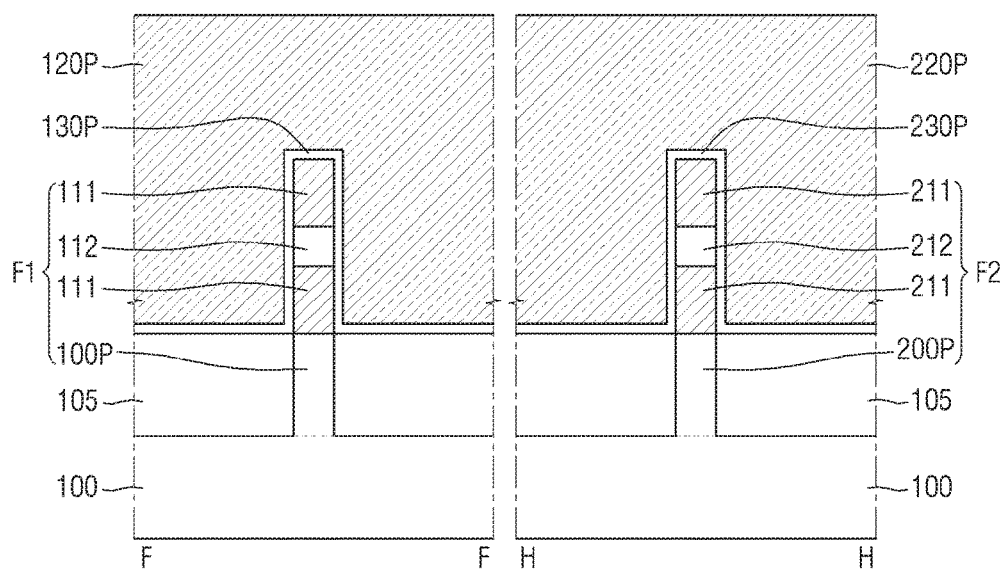

Referring to FIGS. 20 and 21, the interlayer insulating film 180, exposing an upper surface of the first dummy gate electrode 120p and an upper surface of the second dummy gate electrode 220p, may be formed on the field insulating film 105.

More specifically, a portion of the first fin-type structure F1 may be removed using the first dummy gate electrode 120p and the first pre-gate spacer 140p as a mask. By doing this, the first recess 150r may be formed on both sides of the first dummy gate electrode 120p and the first pre-gate spacer 140p.

A first inner spacer 142 may be formed between the first active pattern 112 and the first fin-type protrusion 100P. The first inner spacer 142 may be formed on the first active pattern 112.

Specifically, a portion of the first sacrificial pattern 111 may be removed using etch selectivity between the first active pattern 112 and the first sacrificial pattern 111. Then, in a region from which a portion of the first sacrificial pattern 111 has been removed, the first inner spacer 142 may be formed.

The first epitaxial pattern 150 may be formed within the first recess 150r.

Further, a portion of the second fin-type structure F2 may be removed using the second dummy gate electrode 220p and the second pre-gate spacer 240p as a mask. By doing this, the second recess 250r may be formed on both sides of the second dummy gate electrode 220p and the second pre-gate spacer 240p.

A second inner spacer 242 may be formed between the second active pattern 212, and the second fin-type protrusion 200P. On the second active pattern 212, the second inner spacer 242 may be formed.

Using etch selectivity between the second active pattern 212 and the second sacrificial pattern 211, a portion of the second sacrificial pattern 211 may be removed. Then, in a region from which a portion of the second sacrificial pattern 211 has been removed, the second inner spacer 242 may be formed.

The second epitaxial pattern 250 may be formed within the second recess 150r.

Forming the first recess 150r and forming the second recess 250r may be performed simultaneously, or performed through different processes each other. Further, forming the first epitaxial pattern 150 and forming the second epitaxial pattern 250 may be performed simultaneously, or performed through different processes each other.

The interlayer insulating film 180 may then be formed to overlie the first epitaxial pattern 150 and the second epitaxial pattern 250. Through planarization process, upper surfaces of the first dummy gate electrode 120p and the second dummy gate electrode 220p may be exposed.

While the interlayer insulating film 180 is being formed, each of a first outer spacer 141 and a second outer spacer 241 may be formed.

Figure 22:
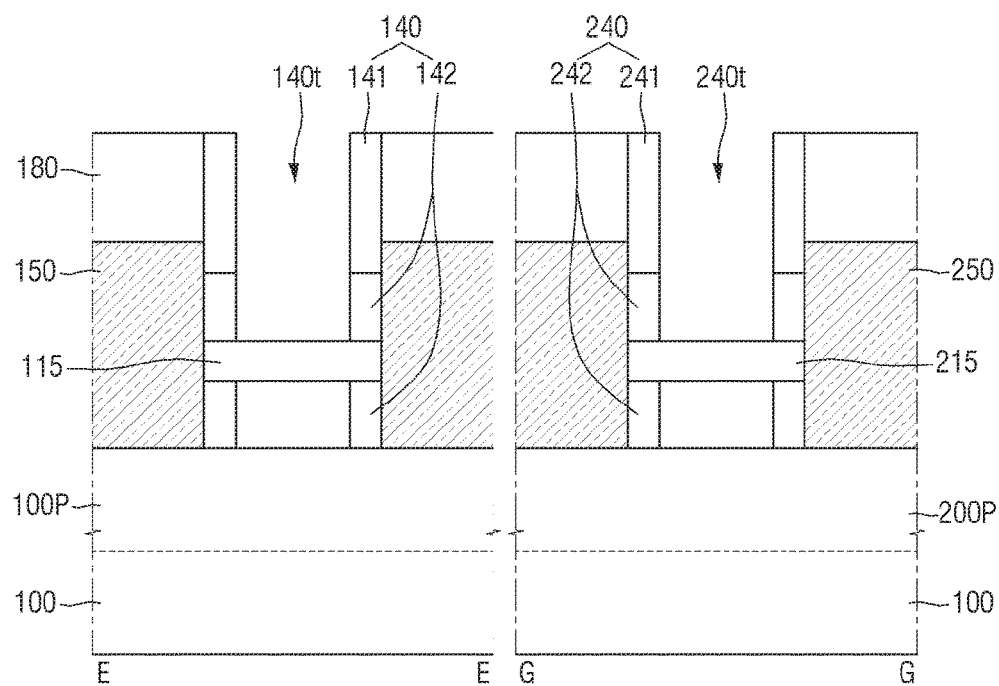
Figure 23:
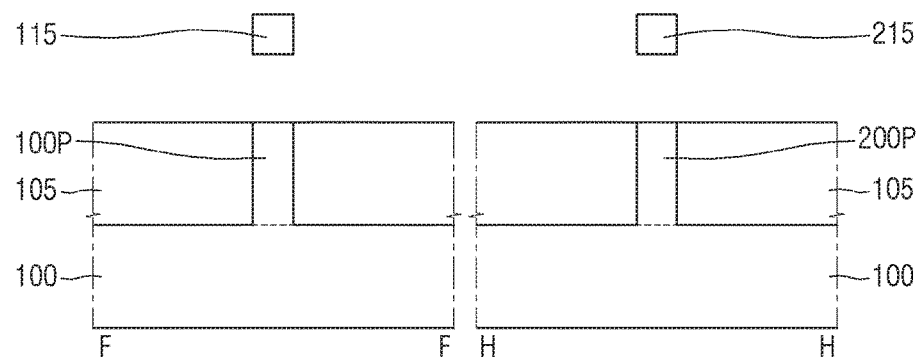

Referring to FIGS. 22 and 23, as the first dummy gate electrode 120p, the first dummy gate insulating film 130p, and the first sacrificial pattern 111 are removed, a first wire pattern 115 may be formed on the substrate 100 of the first region I.

Further, as the second dummy gate electrode 220p, the second dummy gate insulating film 230p, and second sacrificial pattern 211 are removed, a second wire pattern 215 may be formed on the substrate 100 of the second region II.

The first wire pattern 115 may be formed with spacing from the first fin-type protrusion 100P, and the second wire pattern 215 may be formed with spacing from the second fin-type protrusion 200P.

Further, as the first dummy gate electrode 120p, the first dummy gate insulating film 130p, and the first sacrificial pattern 111 are removed, the first trench 140t may be formed being defined by the first gate spacer 140. The first trench 140t may intersect the first wire pattern 115.

Further, as the second dummy gate electrode 220p, the second dummy gate insulating film 230p, and the second sacrificial pattern 211 are removed, the second trench 240t may be formed being defined by the second gate spacer 240. The second trench 240t may intersect the second wire pattern 215.

The first gate spacer 140 may include the first inner spacer 142 and the first outer spacer 141. The second gate spacer 240 may include the second inner spacer 242 and the second outer spacer 241.

Figure 24:
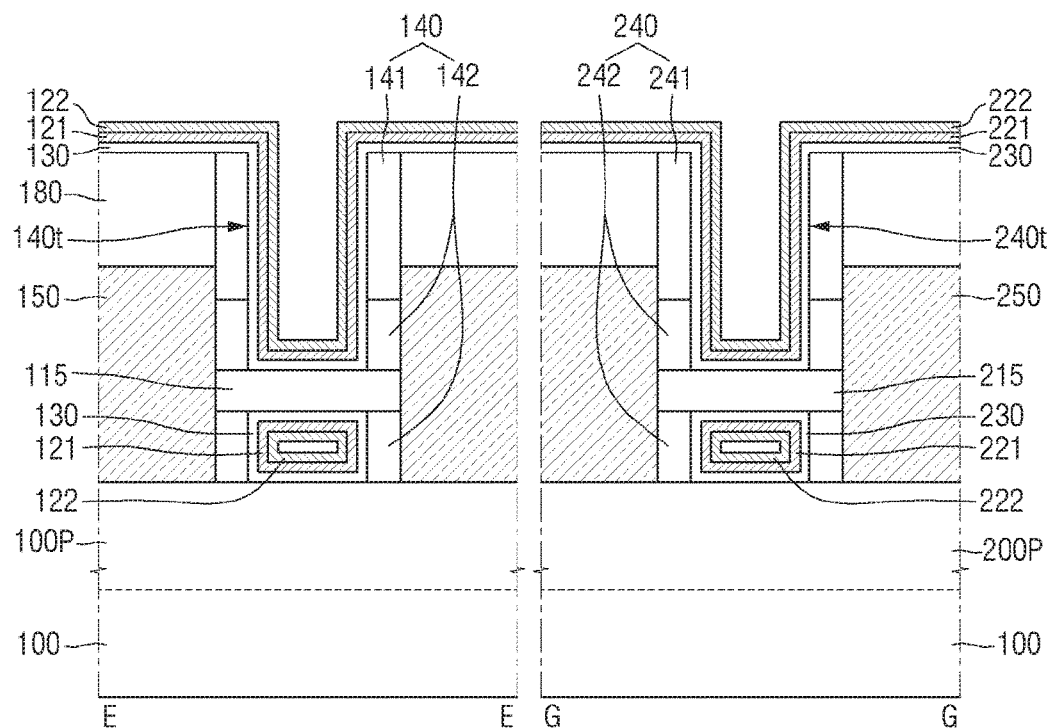
Figure 25:
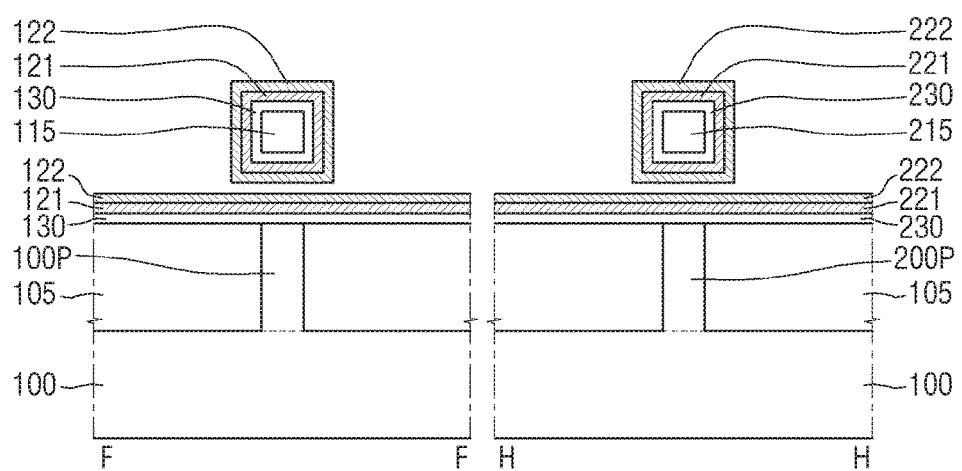

Referring to FIGS. 24 and 25, the first gate insulating film 130 may be formed along the sidewall and the bottom surface of the first trench 140t and the upper surface of the interlayer insulating film 180. Further, a second gate insulating film 230 may be formed along a sidewall and a bottom surface of the second trench 240t and an upper surface of the interlayer insulating film 180.

The first gate insulating film 130 may be formed along a perimeter of the first wire pattern 115, and the upper surface of the field insulating film 105. The second gate insulating film 230 may be formed along a perimeter of the second wire pattern 215, and the upper surface of the field insulating film 105.

The first TaN film 121 may be formed on the first gate insulating film 130. The first TaN film 121 may be formed along a profile of the first gate insulating film 130. The first TaN film 121 may be formed on a sidewall and a bottom surface of the first trench 140t and an upper surface of the interlayer insulating film 180. The first TaN film 121 may be formed along a perimeter of the first wire pattern 115 and the upper surface of the field insulating film 105.

The second TaN film 221 may be formed on the second gate insulating film 230. The second TaN film 221 may be formed along a profile of the second gate insulating film 230. The second TaN film 221 may be formed on a sidewall and a bottom surface of the second trench 240t and an upper surface of the interlayer insulating film 180. The second TaN film 221 may be formed along a perimeter of the second wire pattern 215 and the upper surface of the field insulating film 105.

The first TiN film 122 may be formed on the first TaN film 121. The first TiN film 122 may be formed along a profile of the first TaN film 121. The first TiN film 122 may be formed on a side-wall and a bottom surface of the first trench 140t and an upper surface of the interlayer insulating film 180. The first TiN film 122 may be formed along the perimeter of the first wire pattern 115 and the upper surface of the field insulating film 105.

A second TiN film 222 may be formed on the second TaN film 221. The second TiN film 222 may be formed along a profile of the second TaN film 221. The second TiN film 222 may be formed on a sidewall and a bottom surface of the second trench 240t and an upper surface of the interlayer insulating film 180. The second TiN film 222 may be formed along the perimeter of the second wire pattern 215 and the upper surface of the field insulating film 105.

Through the processes described with reference to FIGS. 8 to 11, the first TiN film 122 may be removed.

The gate electrode intersecting the first wire pattern 115 may be formed by filling the first trench 140t with a conductive material. Further, the gate electrode intersecting the second wire pattern 215 may be formed by filling the second trench 240t with a conductive material.

In concluding the detailed description, those skilled in the art will appreciate that many variations and modifications can be made to example embodiments without substantially departing from the principles of the present disclosure. Therefore, the disclosed example embodiments of the inventive concepts are used in a generic and descriptive sense only and not for purposes of limitation.

What is claimed is:

1. An etching composition having an etching selectivity for titanium nitride (TiN), the etching composition comprising:
    5 wt % to 30 wt % of hydrogen peroxide, greater than 20 wt % and less than 40 wt % of an acid compound, and 0.001 wt % to 5 wt % of a corrosion inhibitor, with respect to a total weight of the etching composition,
    wherein the acid compound includes at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$),
    a pH of the etching composition is less than 2, and the etching selectivity for the titanium nitride with respect to tantalum nitride is equal to or greater than 500.

2. The etching composition of claim 1, wherein the acid compound comprises phosphoric acid.

3. The etching composition of claim 1, wherein the corrosion inhibitor comprises at least one of ammonium peroxysulfate, ammonium sulfate, monoammonium phosphate, diammonium phosphate, triammonium phosphate, ammonium chloride, ammonium acetate, ammonium carbonate, ammonium nitrate, ammonium iodide, 1,2,4-triazole, 3-aminotriazole, 5-aminotetrazole, benzotriazole, pyrazole, imidazole, ascorbic acid, citric acid, succinic acid, maleic acid, malonic acid, thioglycolic acid, tannic acid, methyl gallate, ethyl gallate, and propyl gallate.

4. The etching composition of claim 1, further comprising:
    0.001 wt % to 5 wt % of a chelating agent with respect to the total weight of the etching composition,
    wherein the chelating agent comprises at least one of ethylenediaminetetraacetic acid, iminodiacetic acid, diethylenetriaminepentaacetic acid, glycine, alanine, valine, leucine, isoleucine, serine, threonine, tyrosine, phenylalanine, tryptophane, aspartic acid, glutamic acid, glutamine, asparagine, lysine, arginine, histidine, hydroxylysine, cysteine, methionine, cystine, proline, sulfamic acid, and hydroxyproline.

5. The etching composition of claim 1, further comprising:
    0.001 wt % to 0.1 wt % of a surfactant with respect to the total weight of the etching composition,
    wherein the surfactant comprises at least one of alkyl sulfonate, ammonium alkyl sulfonate, alkyl ether sulfonate, alkyl aryl ether sulfonate, alkyl phosphate, ammonium alkyl phosphate, alkyl ether phosphate, alkyl aryl ether phosphate, fluoroalkyl sulfonimide, ammonium fluoroalkyl sulfonimide, $C_nH_{2n+1}CH_2CH_2SO_3$—$NH_4+$, $C_nH_{2n+1}CH_2CH_2SO_3H$, $(C_nH_{2n+1}CH_2CH_2O)_xPO(ONH_4+)_y(OCH_2CH_2OH)_z$, $C_nH_{2n+1}CH_2CH_2O(OCH_2CH_2OH)_xH$, $C_nH_{2n+1}SO_2N(C_2H_5)(CH_2CH_2)_xH$, $C_nH_{2n+1}CH_2CH_2OCH_2(OH)CH_2CH_2N(C_nH_{2n+1})_2)$ $C_nH_{2n+1}CH_2CH_2OCH_2(OCH_2CH_2)_nCH_2CH_2N(C_nH_{2n+1})_2$, $C_nF_{2n+1}CH_2CH_2SO_3$—$NH_4+C_nF_{2n+1}CH_2CH_2SO_3H$, $(C_nF_{2n+1}CH_2CH_2O)_xPO(ONH_4+)_y(OCH_2CH_2OH)_z$, $C_nF_{2n+1}CH_2CH_2O(OCH_2CH_2OH)_xH$, $C_nF_{2n+1}SO_2N(C_2H_5)(CH_2CH_2)_xH$, $C_nF_{2n+1}CH_2CH_2OCH_2(OH)CH_2CH_2N(C_nF_{2n+1})_2$, and $C_nF_{2n+1}CH_2CH_2OCH_2(OCH_2CH_2)_nCH_2CH_2N(C_nF_{2n+1})_2$,
    where, n is an integer between 1 to 20, when x, y and z are present simultaneously, x, y, and z are real numbers satisfying x+y+z=3, and when x is present alone, x is an integer of 1 to 3.

6. The etching composition of claim 1, wherein the etching composition has a selectivity for removing a titanium nitride film of a stacked film including the titanium nitride film and a tantalum nitride film.

7. The etching composition of claim 1, further comprising:
    deionized water (DIW) as a remainder of the etching composition.

8. The etching composition of claim 1, wherein the etching selectivity is equal to or greater than 1000.

9. The etching composition of claim 1, further comprising:

a solvent as a remainder of the etching composition, the solvent being present in an amount of at least 15 wt % with respect to the total weight of the etching composition.

10. An etching composition having an etching selectivity for titanium nitride (TiN), comprising hydrogen peroxide, an acid compound, and a corrosion inhibitor,
wherein a ratio of a weight of the acid compound with respect to a weight of the hydrogen peroxide is from 1 to 7,
the acid compound comprises at least one of phosphoric acid ($H_3PO_4$), nitric acid ($HNO_3$), hydrochloric acid (HCl), hydroiodic acid (HI), hydrobromic acid (HBr), perchloric acid ($HClO_4$), silicic acid ($H_2SiO_3$), boric acid ($H_3BO_3$), acetic acid ($CH_3COOH$), propionic acid ($C_2H_5COOH$), lactic acid ($CH_3CH(OH)COOH$), and glycolic acid ($HOCH_2COOH$),
a pH of the etching composition is less than 2, and
the etching selectivity for the titanium nitride with respect to tantalum nitride is equal to or greater than 500.

11. The etching composition of claim 10, wherein the acid compound is $H_3PO_4$.

12. The etching composition of claim 10, wherein the etching composition comprises 5 wt % to 30 wt % of the hydrogen peroxide and 15 wt % to 50 wt % of the acid compound, with respect to a total weight of the etching composition.

13. The etching composition of claim 10, wherein the etching composition has a selectivity for removing a titanium nitride film from a stacked film of the titanium nitride film and a tantalum nitride film.

14. The etching composition of claim 10, further comprising:
at least one of a chelating agent and a surfactant.

15. An etching composition comprising:
5 wt % to 30 wt % of hydrogen peroxide, greater than 20 wt % and less than 40 wt % of an acid compound, and 0.001 wt % to 5 wt % of a corrosion inhibitor, with respect to a total weight of the etching composition,
wherein the corrosion inhibitor is at least one of ammonium peroxysulfate, ammonium sulfate, monoammonium phosphate, diammonium phosphate, triammonium phosphate, ammonium chloride, ammonium acetate, ammonium carbonate, ammonium nitrate, ammonium iodide, 1,2,4-triazole, 3-aminotriazole, 5-aminotetrazole, benzotriazole, pyrazole, imidazole, ascorbic acid, citric acid, succinic acid, maleic acid, malonic acid, thioglycolic acid, tannic acid, methyl gallate, ethyl gallate, and propyl gallate,
a pH of the etching composition is less than 2, and
an etching selectivity of the etching composition for titanium nitride with respect to tantalum nitride is equal to or greater than 500.

16. The etching composition of claim 15, wherein the acid compound comprises phosphoric acid.

17. The etching composition of claim 15, further comprising:
0.001 wt % to 5 wt % of a chelating agent with respect to the total weight of the etching composition,
wherein the chelating agent comprises at least one of ethylenediaminetetraacetic acid, iminodiacetic acid, diethylenetriaminepentaacetic acid, glycine, alanine, valine, leucine, isoleucine, serine, threonine, tyrosine, phenylalanine, tryptophane, aspartic acid, glutamic acid, glutamine, asparagine, lysine, arginine, histidine, hydroxylysine, cysteine, methionine, cystine, proline, sulfamic acid, and hydroxyproline.

18. The etching composition of claim 15, further comprising:
deionized water (DIW) as a remainder of the etching composition.

19. The etching composition of claim 15, wherein the acid compound does not include a sulfur-based compound.

* * * * *